(12) United States Patent  (10) Patent No.: US 7,867,810 B2
Hatai  (45) Date of Patent: Jan. 11, 2011

(54) METHOD FOR MANUFACTURING A SOLID-STATE IMAGE CAPTURING APPARATUS

(75) Inventor: Tetsuya Hatai, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/384,938

(22) Filed: Apr. 10, 2009

(65) Prior Publication Data
US 2009/0258456 A1 Oct. 15, 2009

(51) Int. Cl.
*H01L 21/00* (2006.01)
(52) U.S. Cl. .......... 438/75; 438/38; 257/E21.024; 257/E21.033; 430/18; 430/344
(58) Field of Classification Search .......... 257/E21.024, 257/E21.033, E21.035, E21.039; 438/34, 438/70, 78, 75; 430/18, 344
See application file for complete search history.

(56) References Cited

U.S. PATENT DOCUMENTS

| | | | | |
|---|---|---|---|---|
| 5,956,570 A | * | 9/1999 | Takizawa | 438/60 |
| 6,312,970 B1 | * | 11/2001 | Ogawa | 438/60 |
| 6,784,015 B2 | * | 8/2004 | Hatano et al. | 438/75 |
| 7,063,931 B2 | * | 6/2006 | Li et al. | 430/270.1 |
| 2001/0014431 A1 | * | 8/2001 | Nitta et al. | 430/326 |
| 2001/0038970 A1 | * | 11/2001 | Cameron et al. | 430/270.1 |
| 2001/0053570 A1 | * | 12/2001 | Kido | 438/149 |
| 2002/0197558 A1 | * | 12/2002 | Ferreira et al. | 430/270.1 |
| 2005/0228062 A1 | * | 10/2005 | Wolf et al. | 522/6 |
| 2006/0145215 A1 | * | 7/2006 | Paik et al. | 257/293 |
| 2007/0296844 A1 | * | 12/2007 | Tanaka | 348/311 |
| 2008/0090184 A1 | * | 4/2008 | Sui et al. | 430/327 |
| 2009/0283804 A1 | * | 11/2009 | Masuoka et al. | 257/225 |

FOREIGN PATENT DOCUMENTS

JP 2005-332925 12/2005

* cited by examiner

*Primary Examiner*—Caridad M Everhart
(74) *Attorney, Agent, or Firm*—Edwards Angell Palmer & Dodge LLP; David G. Conlin; Peter J. Manus

(57) ABSTRACT

A method for manufacturing a solid-state image capturing apparatus including a pixel array constituted of a plurality of pixels, is provided, where each of the plurality of pixels includes a photoelectric conversion section, the method comprising the steps of: forming an impurity diffusion area in a surface area of a semiconductor substrate; and forming a plurality of different impurity diffusion areas in the surface area of the semiconductor substrate, other than the impurity diffusion area constituting the photoelectric conversion section.

22 Claims, 14 Drawing Sheets

(a)

(b)

(c)

(a)

(b)

(a)

(b)

METHOD FOR MANUFACTURING A SOLID-STATE IMAGE CAPTURING APPARATUS

This nonprovisional application claims priority under 35 U.S.C. §119(a) to Patent Application No. 2008-105106 filed in Japan on Apr. 14, 2008, the entire contents of which are hereby incorporated by reference.

BACKGROUND OF THE INVENTION

1. Field of the Invention

The present invention relates to a method for manufacturing a solid-state image capturing apparatus, and to an electronic information device; and particularly to a method for forming a photoresist mask in a method for manufacturing various solid-state image capturing apparatuses, such as a CCD type image sensor and a CMOS type image sensor, and an electronic information device having therein the solid-state image capturing apparatus obtained by the method for manufacturing a solid-state image capturing apparatus.

2. Description of the Related Art

A conventional solid-state image capturing apparatus, such as a CCD image sensor, generally includes a pixel array constituted of a plurality of pixels, the pixel array being formed on a surface section of a semiconductor substrate; and a peripheral circuit positioned in a peripheral area of the pixel array for reading out a pixel signal from each pixel that constitutes the pixel array. In addition, a portion other than a photodiode section, constituting a pixel on the surface section of the substrate, is shielded by a light shielding film.

FIG. 8 is a diagram illustrating such a conventional CCD image sensor, and FIG. 8(a) schematically illustrates the configuration of the CCD image sensor.

A CCD image sensor 50 includes: a plurality of photodiode sections (photoelectric conversion sections) 30a arranged in a matrix (two dimensionally) for performing a photoelectric conversion; a vertical transfer section (vertical CCD) 30b provided by corresponding to each column of the photodiode section for transferring a signal charge generated by each photodiode section 30a in a vertical direction; a horizontal transfer section (horizontal CCD) 30c for transferring a signal charge from the vertical transfer section 30b in a horizontal direction; and an output section 30d connected to a terminal of the horizontal transfer section 30c for amplifying the horizontally transferred signal charge to output it as a signal voltage. Herein, each photodiode section 30a constitutes each pixel Px in the CCD image sensor 50, together with a corresponding part of the vertical transfer section 30b, and the output section 30d is constituted of a MOS transistor.

FIG. 8(b) is a plan view illustrating the layout of the photodiode 30a and the vertical transfer section 30b that constitute the CCD image sensor 50. FIG. 9 is a diagram illustrating a cross sectional structure along the line V-V in FIG. 8(b).

For example, as illustrated in FIG. 8(b) and FIG. 9, a P-type semiconductor well area 32 is formed in a surface area of a semiconductor substrate 31, such as an N-type silicon substrate; and an N-type impurity diffusion area 33 constituting the photodiode section (photoelectric conversion section) 30a is arranged in a matrix in the P-type semiconductor well area 32. Herein, a P-type ($P^{++}$) impurity diffusion area 34 is formed on the surface of the N-type impurity diffusion area 33; and the photodiode section 30a has a buried photodiode structure.

Further, in the P-type semiconductor well area 32, an N-type impurity diffusion area 37 and a P-type ($P^+$) impurity diffusion area 36 are formed along the column of the photodiode sections 30a that form a line in a vertical direction. In addition, a P-type impurity diffusion area 35, which constitutes a readout gate area functioning as an electric charge readout section, is positioned between the photodiode sections 30a and the vertical CCD section 30b that is positioned on one side thereof. Further, P-type ($P^+$) impurity diffusion areas 38 are formed between adjacent photodiode sections 30a and between the photodiode section 30a and the vertical CCD section 30b, the P-type ($P^+$) impurity diffusion areas 38 functioning as a channel stop area for electrically separating the photodiode sections 30a and the vertical CCD section 30b.

Further, as illustrated in FIG. 9, an insulation film 39, such as a $SiO_2$ film, is formed on a surface of the P-type semiconductor well area 32, and an electric charge transfer electrode 41 is formed above the insulation film 39 with an insulation film 40, such as a $Si_3N_4$ film, interposed therebetween in the N-type impurity diffusion area 37 that constitutes the vertical CCD section 30b. The electric charge transfer electrode 41 is covered by an interlayer insulation film 42. In addition, a light shielding film 43 is formed on the interlayer insulation film 42 such that the light shielding film 43 is configured to include an opening at a portion corresponding to the high concentration P-type impurity diffusion area 34 to allow light to enter only at the photodiode section 30a. This light shielding film is formed of a metal, such as aluminum (Al), tungsten (W), and titanium (Ti), and the light shielding film is formed by selective etching for the metal film.

Further, an interlayer insulation film 44 and further a BPSG film 45 as a planarization film, the BPSG film 45 being a surface protection film constituted of PSG (phosphor silicate glass), are consecutively formed on the entire surface of the P-type semiconductor well area 32. Normally, a microlens (not shown) and a color filter (not shown) are formed on such a planarization film in a solid-state image capturing apparatus.

Conventionally, in a solid-state image capturing apparatus of this type, a method is taken where a photodiode section (photoelectric conversion section), for example, is formed also in a deeper area of a substrate in order to improve the sensitivity characteristic as well as to maintain and improve the sensitivity characteristic against reducing the pixel size, so that a signal charge accumulating section is enlarged in the photodiode to increase an effective area of the signal charge accumulating section (see Reference 1, for example).

Thus, in order to form the photodiode section (photoelectric conversion section) to reach a deeper area in the substrate for improving the sensitivity, it is necessary to increase the energy amount of an impurity implantation. Therefore, when an impurity implantation preventing film is formed with a photoresist on the substrate in order to form a desired impurity implantation area (i.e., the above mentioned impurity diffusion area) that reaches the deeper area in the substrate, a sufficient thickness of the photoresist is required so as not to allow the impurity to reach the portion on the substrate where the impurity implantation should be avoided.

On the other hand, the surface area of the photodiode section (photoelectric conversion section) per pixel is being reduced along with an increase in the number of effective pixels as well as the reduction of the chip size of latest solid-state image capturing element devices. Due to this, regarding an exposure light source for processing a photoresist film used for the impurity implantation preventing film for forming the photodiode section (photoelectric conversion section), it is not possible to deal with the miniaturization of the processing size for a photoresist film thickness without using a light source of a KrF excimer laser (λ=248 nm), instead of a conventional i-line (λ=365 nm).

In an exposure apparatus using a KrF excimer laser as its light source, the optical members are limited to those with high transmissivity up to and including the wavelength of 248 nm, and optical systems using only synthetic quartz are common. Therefore, it becomes necessary to use a laser in which the oscillation wavelength is narrowed (up to 0.3 pm), the exposure intensity by the layer being weaker compared to an exposure apparatus of i-line and the like, since a single optical member cannot correct a color aberration, and as a result, it is necessary to use a resist which has a high sensitivity.

Accordingly, as the method for achieving a high sensitivity, an explanation will be described with reference to a positive type high sensitivity resist.

A resist film constituted of a high sensitivity resist generates acid from a photo-acid-generating agent combined in the resist film at exposure of the resist film. Then, the acid acts, for a large number of times, on a base resin, in which a dissolution inhibition group that is desorbed by acid is introduced, thereby making the dissolution inhibitor group desorbed from the base resin of the exposure portion of the resist to increase dissolution of the base resin to a developing solution. A large number of reactions that cause the change in the dissolution are caused by acid in the high sensitivity resist film having such a structure, even when the quantum yield of acid to be generated by exposure is 1 or less. As a result, the quantum yield of acid in an effective reaction becomes far greater than 1. Therefore, such a high sensitivity resist is usually referred to as chemical amplification type (system) resists.

Types of photo-acid-generating agents, which are combined with a photoresist for a KrF excimer laser light source, the photoresist being one of the chemical amplification type resists, included are onium salt including iodonium salt and sulfonium salt, halogen compound, ortho-nitrobenzyl ester, alkylsulfonate acid ester, and sulfonyl compound.

FIG. 10 illustrates iodonium salt O1 (FIG. 10($a$)) and sulfonium salt O2 (FIG. 10($b$)), as onium salt which is a representative photo-acid-generating agent. FIG. 1 illustrates a halogen compound H1 (FIG. 11($a$)) and a halogen compound H2 (FIG. 11($b$)), as a photo-acid-generating agent. Further, FIG. 12 illustrates sulfonate acid ester S1 to S10 (FIG. 12($a$) to ($j$)) as photo-acid-generating agents.

When a minute processing size for a resist film having a large thickness is achieved as described above while the verticality of the resist taper angle is maintained at an opening portion of the resist, iodonium salt is used as onium salt due to the controllability of the diffusion distance of the acid generated and the like.

Reference 1: Japanese Laid-Open Publication No. 2005-332925

SUMMARY OF THE INVENTION

In a case where an impurity implantation area that constitutes a photodiode section (photoelectric conversion section) and an impurity implantation area adjacent to the photodiode section (e.g., channel stop section) are formed as described above, when a photoresist film is used as an impurity implantation mask for the purpose of preventing the impurity from being implanted, on a portion where an impurity implantation area is not formed in a substrate, white defects or dark current may get worse if the photoresist film is mixed with iodonium salt, as onium salt which is a photo-acid-generating agent.

FIG. 13 relatively illustrates an arbitral unit of the number of white defects occurring (axis of ordinates) with respect to the content ratio of iodonium salt in a chemical amplification type resist used as an impurity implantation mask (axis of abscissas), with regard to two kinds of chemical amplification type resists.

That is, measurement points X1 to X4 denote the number of white defects occurred with respect to the content ratio of iodonium salt in a first chemical amplification type resist (X resist), and measurement points Y1 to Y3 denote the number of white defects occurred with respect to the content ratio of iodonium salt in a second chemical amplification type resist (Y resist) different from the first chemical amplification type resist (X resist). In the axis of abscissas illustrated in FIG. 13, the content ratio of iodonium salt in a generally used chemical amplification type resist, which is used as a reference for the comparison (referred to as reference resist, hereinafter) is defined to be 1.0. For example, in the resist indicated by this content ratio value (1.5), it is indicated that the content ratio of the iodonium salt is 1.5 times the content ratio of the iodonium salt in the reference resist; and in the resist indicated by this content ratio value (0.0), it is indicated that the content ratio of the iodonium salt is 0 times the content ratio of the iodonium salt in the reference resist, which indicates that iodonium salt is not contained. Further, the number of white defects that have occurred and denoted by an arbitrary unit represents the relative number between the measurement points listed here. For example, it is indicated that the number of white defects as for the resist that corresponds to the measurement point X1 is about 3000, in the case where the number of the white defects as for the resist that corresponds to the measurement point X3 is 30000.

As described above, as the content ratio of the iodonium salt increases in the chemical amplification type resist used for the manufacturing of a solid-state image capturing apparatus, an increase in the number of white defects in the manufactured solid-state image capturing apparatus occurs. This is because iodine atoms contained in the chemical amplification type resist are implanted into an impurity diffusion area that constitutes a photodiode.

That is, when an impurity implantation area (impurity diffusion area) that constitutes a photodiode section (photoelectric conversion section) and an impurity implantation (impurity diffusion area) area adjacent to the photodiode section are formed, the dosage of the impurity is 1E10-1E15 $cm^{-2}$, and the energy amount is 400-4000 KeV, which is a large value. Therefore, the film thickness of the photoresist film used as an impurity implantation preventing film needs to be about 3000 to 80000 Å. In this case, the iodine atoms contained in the photoresist film as a photo-acid-generating agent is affected by knocking or spattering from a resist taper portion of the resist opening side wall, which forms a resolution pattern, of the photoresist film having a high film thickness at the impurity implantation preventing time, and as a result, iodine atoms are also implanted in the vicinity of the boarder of the photodiode section (photoelectric conversion section) in the substrate.

FIG. 14 is a diagram illustrating a state in which the iodine atoms are implanted from the photoresist film into the photodiode section in the substrate.

That is, as illustrated in FIG. 14($a$), in a photoresist film 11 of a high film thickness formed on a substrate 10, when the resist opening inner-wall surface is not vertical, the wall is tapered pushing towards the inside of the opening. Because of this, the resist film thickness is thin against an impurity 12 entering obliquely to the side wall at the lower portion of the tapered side wall, and iodine atoms 13 are implanted into a photodiode section inside the substrate 10 by the knocking or spattering of the iodine atoms 13 due to the impurity as described above. Alternatively, when the impurity is implanted obliquely in a shape where the diffusion distance of the photo-acid-generating agent is controlled and the shape has vertical resolution, the iodine atoms 13 are also implanted into the photodiode section inside the substrate 10 in the lower portion by the knocking or spattering of the iodine atoms 13 due to the impurity.

As illustrated in FIG. 14(*b*), as foreign substances, the iodine atoms 13 implanted beyond expectation into the substrate damage the atom configuration by penetrating between the atoms in the impurity implantation area that form the photodiode section (photoelectric conversion section), or become starting points for supplying and capturing irregular electrons in the impurity implantation area, to cause white defects or dark current, resulting in lowering the yield rate of the manufacturing of the solid-state image capturing apparatus.

The present invention is intended to solve the conventional problems described above. The objective of the present invention is to provide a method for manufacturing a solid-state image capturing apparatus, in which iodine, which is a constituent element of a photo-acid-generating agent of an impurity implantation preventing film, is prevented from being implanted from the impurity implantation preventing film, such as a chemical amplification type resist film, which is used as an implantation mask of impurity, into a photodiode section formed in a substrate, thereby reducing the occurrence of white defects and dark current due to crystal defect in the photodiode section and improving the yield rate of the solid-state image capturing apparatus. Further, the objective of the present invention is to provide an electronic information device having therein the solid-state image capturing apparatus obtained by the method for manufacturing a solid-state image capturing apparatus.

A method for manufacturing a solid-state image capturing apparatus according to the present invention including a pixel array constituted of a plurality of pixels, where each of the plurality of pixels includes a photoelectric conversion section, includes the steps of: forming an impurity diffusion area in a surface area of a semiconductor substrate, wherein the impurity diffusion area constitutes the photoelectric conversion section; and forming a plurality of different impurity diffusion areas in the surface area of the semiconductor substrate, other than the impurity diffusion area constituting the photoelectric conversion section, wherein the step of forming the impurity diffusion area constituting the photoelectric conversion section includes a step of forming a resist mask for preventing implantation of an impurity in the surface area of the semiconductor substrate by the exposure and development of a resist material that includes a photo-acid-generating agent, and wherein the resist material is obtained by replacing at least a portion of iodonium salt contained in a chemical amplification type resist with a photo-acid-generating agent which does not contain iodine, wherein the chemical amplification type resist contains iodonium salt content as the photo-acid-generating agent, wherein the iodonium salt content is determined based on at least a wavelength of an exposure light and a film thickness of the resist mask, thereby achieving the objective described above.

Preferably, in a method for manufacturing a solid-state image capturing apparatus according to the present invention, the photo-acid-generating agent which does not contain iodine is selected from the group consisting of sulfonium salt as onium salt, halogen compound, and sulfonic acid ester.

Still preferably, in a method for manufacturing a solid-state image capturing apparatus according to the present invention, the resist material is obtained by replacing all the iodonium salt contained in the chemical amplification type resist with a photo-acid-generating agent that does not contain iodine.

Still preferably, in a method for manufacturing a solid-state image capturing apparatus according to the present invention, the resist material is obtained by replacing at least ½ of iodonium salt contained in the chemical amplification type resist with a photo-acid-generating agent that does not contain iodine.

Still preferably, in a method for manufacturing a solid-state image capturing apparatus according to the present invention, the resist material is obtained by replacing at least ⅞ of iodonium salt contained in the chemical amplification type resist with a photo-acid-generating agent that does not contain iodine.

Still preferably, in a method for manufacturing a solid-state image capturing apparatus according to the present invention, the resist mask is patterned such that a resist opening is positioned in an area corresponding to the photoelectric conversion section, and the content of the photo-acid-generating agent of the chemical amplification type resist is further determined based on an inclining angle of a resist side surface in the resist opening, in addition to the wavelength of an exposure light and the film thickness of the resist mask.

Still preferably, in a method for manufacturing a solid-state image capturing apparatus according to the present invention, the step of forming the impurity diffusion area constituting the photoelectric conversion section includes a step of forming the impurity diffusion area constituting the photoelectric conversion section by performing implantation of an impurity using the resist mask.

Still preferably, in a method for manufacturing a solid-state image capturing apparatus according to the present invention, the exposure light is a light with a wavelength of 248 nm obtained by a KrF excimer laser.

Still preferably, in a method for manufacturing a solid-state image capturing apparatus according to the present invention, the resist mask has a film thickness of 3000 to 80000 Å.

Still preferably, in a method for manufacturing a solid-state image capturing apparatus according to the present invention, the resist mask has a film thickness of 20000 to 40000 Å.

Still preferably, in a method for manufacturing a solid-state image capturing apparatus according to the present invention, a step of forming at least one of the plurality of different impurity diffusion areas other than the impurity diffusion area constituting the photoelectric conversion section includes a step of forming a resist mask for preventing implantation of an impurity in the surface area of the semiconductor substrate by the exposure and development of a resist material that includes a photo-acid-generating agent; and the resist material is obtained by replacing at least a portion of iodonium salt contained in a chemical amplification type resist with a photo-acid-generating agent which does not contain iodine, the chemical amplification type resist contains iodonium salt content as the photo-acid-generating agent, wherein the iodonium salt content is determined based on at least a wavelength of an exposure light and a film thickness of the resist mask.

Still preferably, in a method for manufacturing a solid-state image capturing apparatus according to the present invention, at least one of the plurality of different impurity diffusion areas other than the impurity diffusion area constituting the photoelectric conversion section is an impurity diffusion area adjacent to the impurity diffusion area constituting the photoelectric conversion section.

Still preferably, in a method for manufacturing a solid-state image capturing apparatus according to the present invention, the photo-acid-generating agent which does not contain iodine is selected from the group consisting of sulfonium salt as onium salt, halogen compound, and sulfonic acid ester.

Still preferably, in a method for manufacturing a solid-state image capturing apparatus according to the present invention, the resist material is obtained by replacing all the iodonium salt contained in the chemical amplification type resist with a photo-acid-generating agent that does not contain iodine.

Still preferably, in a method for manufacturing a solid-state image capturing apparatus according to the present invention, the resist material is obtained by replacing at least ½ of iodonium salt contained in the chemical amplification type resist with a photo-acid-generating agent that does not contain iodine.

Still preferably, in a method for manufacturing a solid-state image capturing apparatus according to the present invention, the resist material is obtained by replacing at least ⅞ of iodonium salt contained in the chemical amplification type resist with a photo-acid-generating agent that does not contain iodine.

Still preferably, in a method for manufacturing a solid-state image capturing apparatus according to the present invention, the solid-state image capturing apparatus includes: a vertical electric charge transfer section for transferring a signal charge generated at the photoelectric conversion section; an electric charge readout section formed in between the photoelectric conversion section and the vertical electric charge transfer section for reading out the electric charge from the photoelectric conversion section to the vertical electric charge transfer section; and a channel stop section for electrically separating adjacent photoelectric conversion sections, and electrically separating the photoelectric conversion section and the vertical electric charge transfer section, and each of the plurality of different impurity diffusion areas other than the impurity diffusion area constituting the photoelectric conversion section, forms the vertical electric charge transfer section, the electric charge readout section, and the channel stop section.

Still preferably, in a method for manufacturing a solid-state image capturing apparatus according to the present invention, a step of forming anyone of the plurality of different impurity diffusion areas other than the impurity diffusion area constituting the photoelectric conversion section includes a step of forming an impurity diffusion area constituting the vertical electric charge transfer section, the electric charge readout section, or the channel stop section, by implanting an impurity using the resist mask.

Still preferably, in a method for manufacturing a solid-state image capturing apparatus according to the present invention, the step of forming at least one of the plurality of different impurity diffusion areas other than the impurity diffusion area constituting the photoelectric conversion section includes a step of forming an impurity diffusion area constituting the vertical electric charge transfer section; the resist mask is patterned such that a resist opening is positioned in an area corresponding to the vertical electric charge transfer section; and the content of the photo-acid-generating agent of the chemical amplification type resist is further determined based on an inclining angle of a resist side surface in the resist opening, in addition to the wavelength of an exposure light and the film thickness of the resist mask.

Still preferably, in a method for manufacturing a solid-state image capturing apparatus according to the present invention, the step of forming at least one of the plurality of different impurity diffusion areas other than the impurity diffusion area constituting the photoelectric conversion section is a step of forming an impurity diffusion area constituting the electric charge readout section; the resist mask is patterned such that a resist opening is positioned in an area corresponding to the electric charge readout section; and the content of the photo-acid-generating agent of the chemical amplification type resist is further determined based on an inclining angle of a resist side surface in the resist opening, in addition to the wavelength of an exposure light and the film thickness of the resist mask.

Still preferably, in a method for manufacturing a solid-state image capturing apparatus according to the present invention, the step of forming at least one of the plurality of different impurity diffusion areas other than the impurity diffusion area constituting the photoelectric conversion section is a step of forming an impurity diffusion area constituting the channel stop section; the resist mask is patterned such that a resist opening is positioned in an area corresponding to the channel stop section; and the content of the photo-acid-generating agent of the chemical amplification type resist is further determined based on an inclining angle of a resist side surface in the resist opening, in addition to the wavelength of an exposure light and the film thickness of the resist mask.

A method for manufacturing a solid-state image capturing apparatus according to the present invention including a pixel array constituted of a plurality of pixels, each of the plurality of pixels including a photoelectric conversion section, includes the steps of: forming an impurity diffusion area in a surface area of a semiconductor substrate, wherein the impurity diffusion area constitutes the photoelectric conversion section; and forming a plurality of different impurity diffusion areas in the surface area of the semiconductor substrate, other than the impurity diffusion area constituting the photoelectric conversion section, wherein the step of forming the impurity diffusion area constituting the photoelectric conversion section includes the step of: forming an insulation film which is formed of a silicon oxide film or a silicon nitride film in a surface area of the semiconductor substrate; forming an insulation hard mask for preventing impurity implantation by patterning the insulation film with a resist mask; and selectively implanting an impurity using the insulation hard mask, thereby achieving the objective described above.

An electronic information device according to the present invention includes an image capturing section, where the solid-state image capturing apparatus obtained by the method for manufacturing a solid-state image capturing apparatus according to the present invention is used as the image capturing section, thereby achieving the objective described above.

An electronic information device according to the present invention includes an image capturing section, where the solid-state image capturing apparatus obtained by the method for manufacturing a solid-state image capturing apparatus according to the present invention is used as the image capturing section, thereby achieving the objective described above.

The functions of the present invention will be described hereinafter.

According to the present invention, what is used as a resist material for a resist mask (impurity implantation preventing film) for preventing the implantation of an impurity, is a resist material that is obtained by replacing at least a portion of iodonium salt contained in a chemical amplification type resist with a photo-acid-generating agent which does not contain iodine, the chemical amplification type resist containing iodonium salt, which is a photo-acid-generating agent, of the content determined based on at least the wavelength of an exposure light and the film thickness of the resist mask, thereby reducing the damage due to the penetration of iodine from a photoresist film used as an impurity implantation preventing film into a photodiode section (photoelectric conversion section) so as to effectively prevent white defects and dark current from occurring and to improve the yield rate of the solid-state image capturing apparatus.

Further, according to the present invention, when at least one impurity implantation area of an electric charge transfer section, an electric charge readout section for reading out a signal charge from a photoelectric conversion section to the electric charge transfer section, and a channel stop section for electrically separating the photoelectric conversion section from the electric charge transfer section, which are in the vicinity of the photodiode section (photoelectric conversion section), is formed, a resist mask composed of a chemical amplification type resist in which the content of a photo-acid-generating agent including iodine is limited, is used as described above. Therefore, when the impurity implantation area is formed, it is possible to reduce the damage due to the penetration of iodine from the resist mask used as an impurity implantation preventing film into the photodiode section (photoelectric conversion section).

Further, according to the present invention, since an insulating hard mask is used as an impurity implantation preventing film for preventing the impurity implantation, the damage due to the penetration of iodine from the resist mask used as an impurity implantation preventing film into the photodiode section (photoelectric conversion section) is prevented, thereby effectively preventing white defects and dark current from occurring and improving the yield rate of the solid-state image capturing apparatus.

According to the present invention as described above, in a method for manufacturing the solid-state image capturing apparatus when an impurity implantation area that constitutes a photodiode section in a pixel is formed, a resist material obtained by replacing at least a portion of iodonium salt contained in a chemical amplification type resist containing iodonium salt, which functions as a photo-acid-generating agent, of the content determined based on at least the wavelength of an exposure light and the film thickness of the resist mask with a photo-acid-generating agent without iodine is used as a resist material for a resist mask (impurity implantation preventing film) for preventing the implantation of an impurity. Therefore, the damage to the atom configuration due to the penetration of iodine is reduced in the vicinity of the boarder of the photodiode section (photoelectric conversion section) in the substrate, and as a result, it is possible to effectively prevent white defects and dark current from occurring to improve the yield rate of the solid-state image capturing apparatus.

Further, according to the present invention, in a method for manufacturing the solid-state image capturing apparatus when an impurity implantation area that constitutes a photodiode section in a pixel is formed, an insulating hard mask, which is patterned by a photolithography technique as an impurity implantation preventing layer for preventing the impurity implantation, is used. Therefore, the damage to the atom configuration due to the penetration of iodine is avoided in the vicinity of the boarder of the photodiode section (photoelectric conversion section) in the substrate, and as a result, it is possible to effectively prevent white defects and dark current from occurring to improve the yield rate of the solid-state image capturing apparatus.

These and other advantages of the present invention will become apparent to those skilled in the art upon reading and understanding the following detailed description with reference to the accompanying figures.

BRIEF DESCRIPTION OF THE DRAWINGS

FIG. 8(b) is a plan view illustrating the layout of ion implantation areas that constitute a photodiode and a vertical CCD section of the CCD image sensor.

Figure 1:
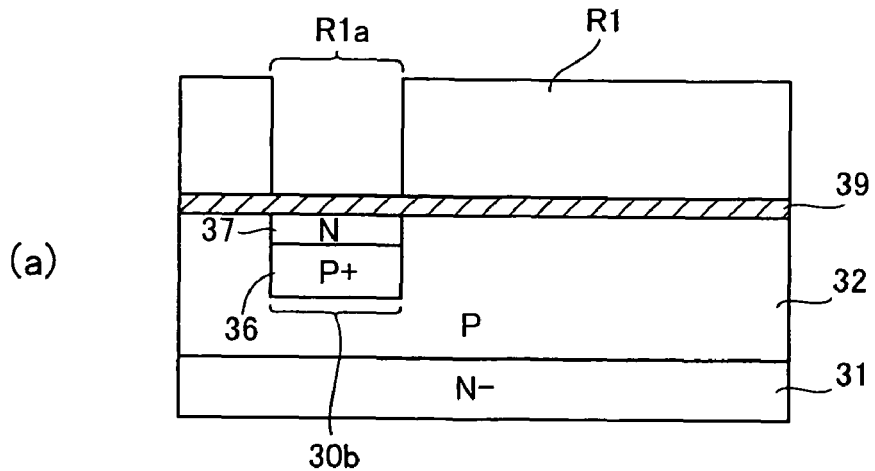
FIG. 1 is a diagram for describing a method for manufacturing a solid-state image capturing apparatus according to Embodiment 1 of the present invention, where processes are illustrated in the order of the steps (FIGS. 1(a) to 1(c)) for forming an impurity diffusion area that constitutes a vertical CCD section in a surface area of a semiconductor substrate.
Figure 1:
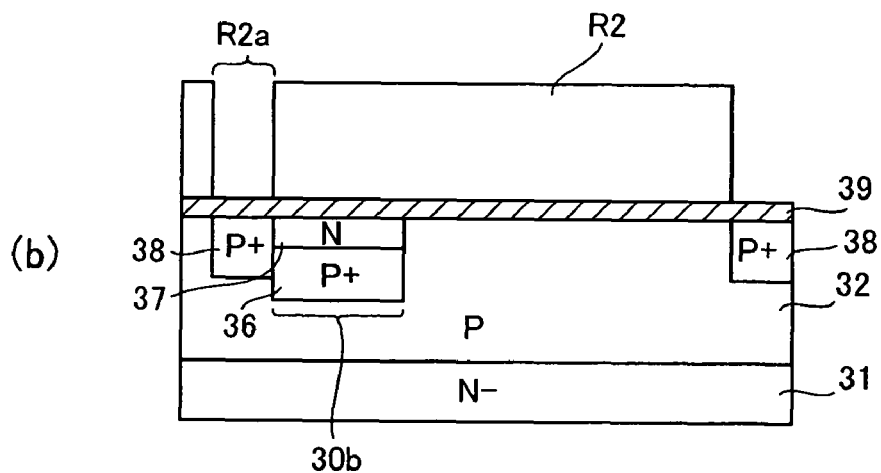
Figure 1:
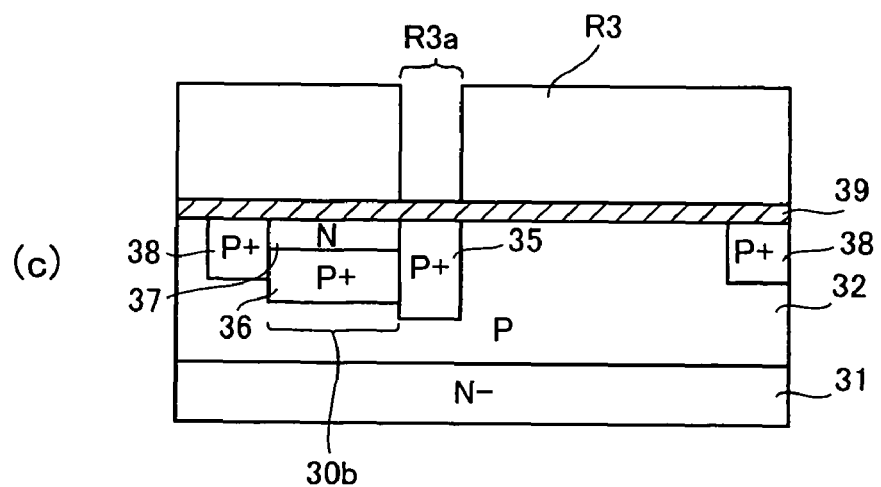

30a photodiode
30b vertical CCD
30c horizontal CCD
30d output section
31 N-type silicon substrate
32 P-type semiconductor
33 N-type impurity diffusion area
34 high concentration P-type impurity diffusion area
35 P-type semiconductor area
36 P-type semiconductor active area
37 N-type semiconductor active area
38 P-type impurity diffusion area
39 $SiO_2$ film
40 $Si_3N_4$ film
41 electric charge transfer electrode
42 interlayer insulation film
43 light shielding film
44 interlayer insulation film
45 BPSG film
50 CCD type solid-state image capturing apparatus
R1 to R4 resist film
R1a to R4a resist opening

DESCRIPTION OF THE PREFERRED EMBODIMENTS

Hereinafter, embodiments of the present invention will be described with reference to the accompanying figures.

Embodiment 1

Figure 2:
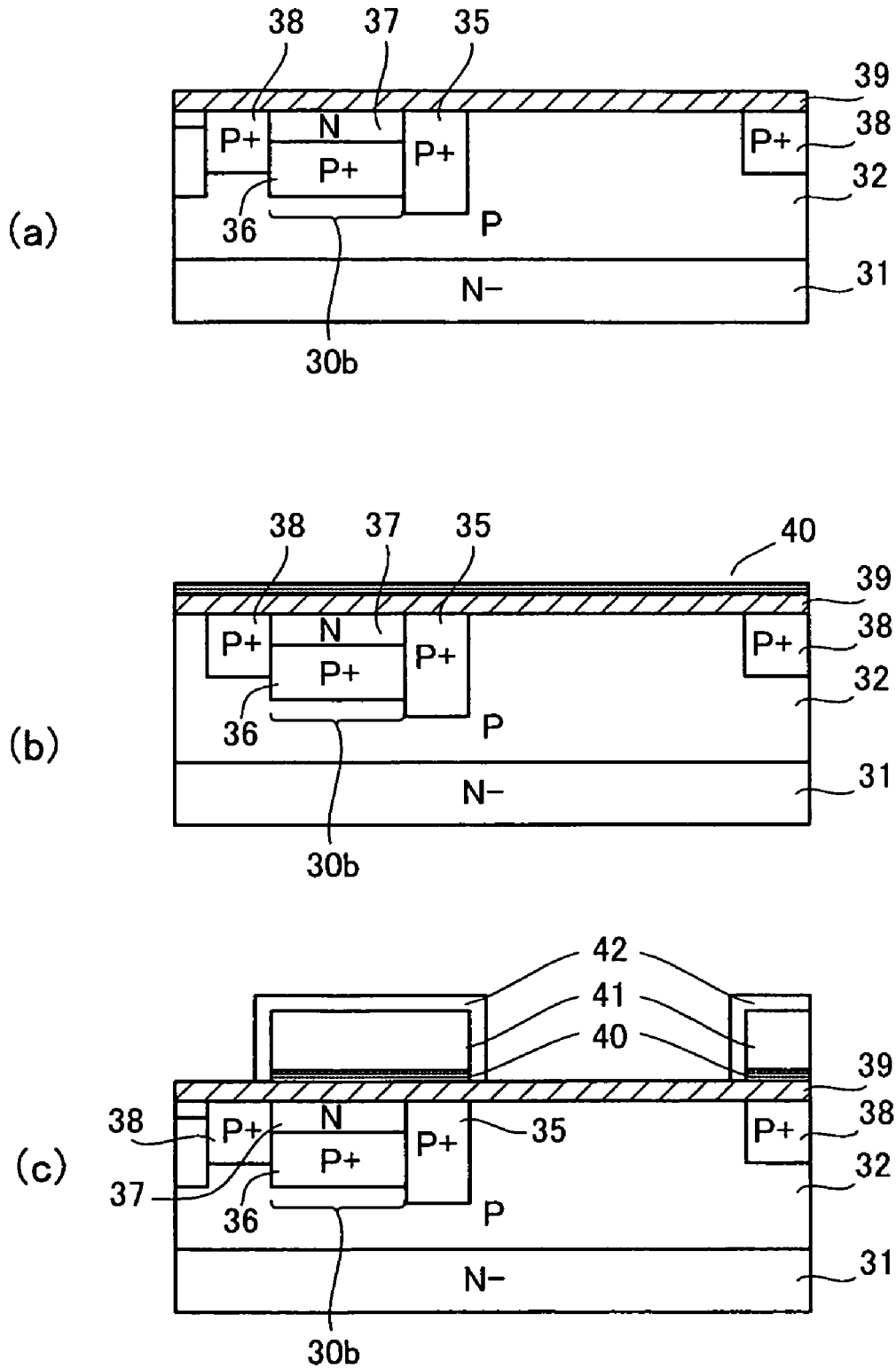
FIG. 2 is a diagram for describing a method for manufacturing a solid-state image capturing apparatus according to Embodiment 1 of the present invention described above, where processes are illustrated in the order of the steps (FIGS. 2(a) to 2(c)) for forming a transfer electrode that constitutes a vertical CCD section in a surface area of a semiconductor substrate.
Figure 3:
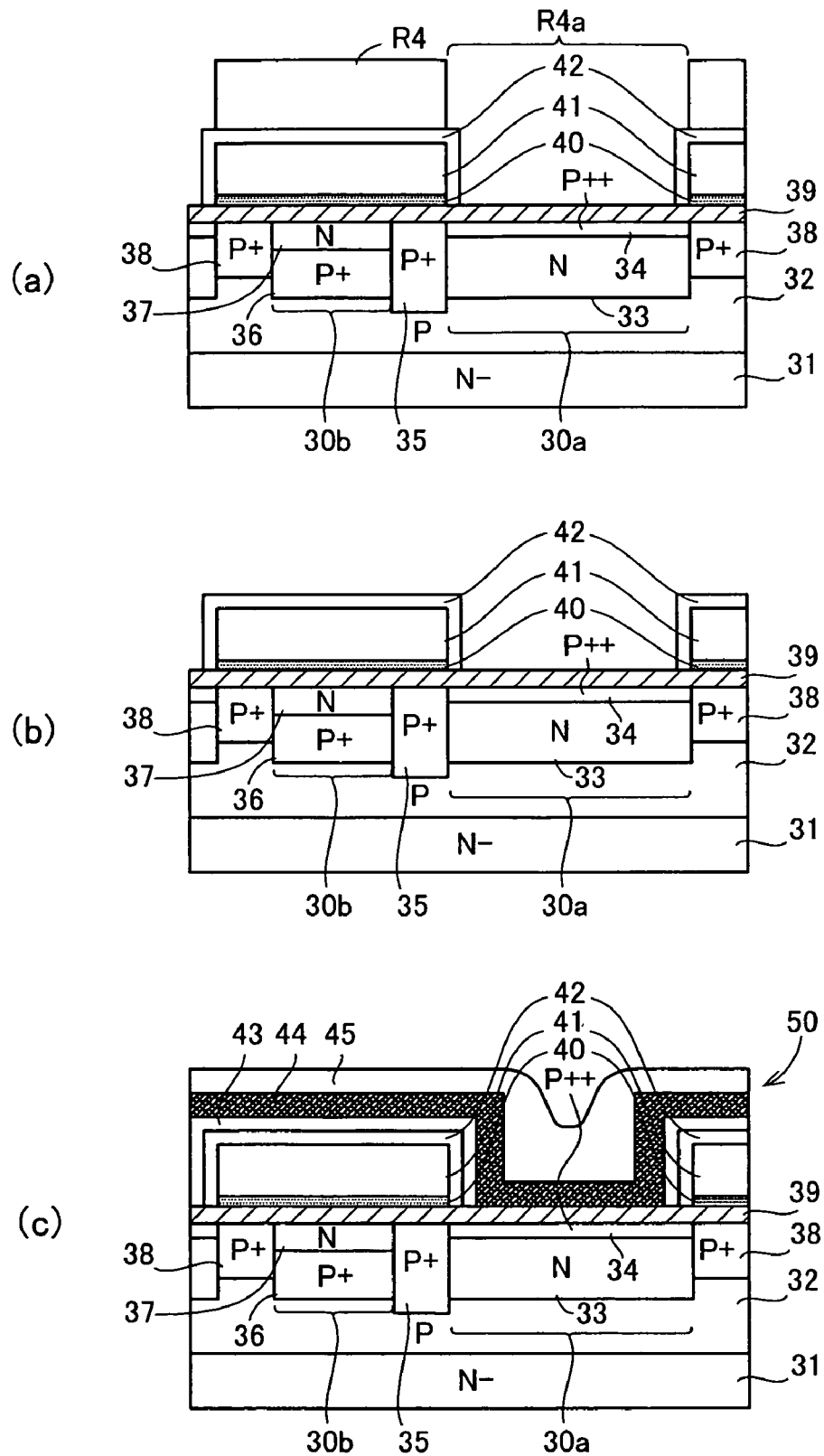
FIG. 3 is a diagram for describing a method for manufacturing a solid-state image capturing apparatus according to Embodiment 1 of the present invention described above, where processes are illustrated (FIGS. 3(a) and 3(b)) for forming an impurity diffusion area that constitutes a photodiode in a surface area of a semiconductor substrate, and for forming a planarization film (FIG. 3(c)).

FIGS. 1 through 3 are diagrams illustrating a method for manufacturing a solid-state image capturing apparatus according to Embodiment 1 of the present invention. FIGS. 1(a) to 1(c) illustrate a process for forming an impurity diffusion area where a vertical CCD section is configured, in a surface area of a semiconductor substrate, in the order of the steps. FIGS. 2(a) to 2(c) illustrate a process for forming a transfer electrode where a vertical CCD section is configured, in a surface area of a semiconductor substrate, in the order of the steps.

FIGS. 3(a) and 3(b) illustrate a process for forming an impurity diffusion area where a photodiode is configured in a surface area of a semiconductor substrate. FIG. 3(c) illustrates a forming process of a planarization film.

As illustrated in FIG. 3(c), a solid-state image capturing apparatus 50 manufactured by the method for manufacturing a solid-state image capturing apparatus according to Embodiment 1 includes: a plurality of photodiode sections 30a formed in such a manner to be arranged in a matrix in a P-type well area 32 on a surface of a semiconductor substrate 31, such as an N-type silicon substrate; and vertical CCD sections 30b formed along each column of the photodiode sections 30a in the P-type well area 32. In addition, the solid-state image capturing apparatus 50 includes: a P-type impurity diffusion area 35 positioned in between the photodiode section 30a and the vertical CCD section 30b that is positioned on one side of the photodiode section 30a, constituting a readout gate area functioning as an electric charge readout section; and a P-type ($P^+$) impurity diffusion area 38 formed in between adjacent photodiode sections 30a and in between the photodiode section 30a and the vertical CCD section 30b, functioning as a channel stop area for electrically separating these sections.

In addition, an electric charge transfer electrode 41 is formed above the N-type impurity diffusion area 37 that constitutes the vertical CCD section 30b with insulation films 39 and 40 interposed therebetween; and the electric charge transfer electrode 41 is covered by an interlayer insulation film 42. In addition, a light shielding film 43 is formed on the interlayer insulation film 42 with an opening at a portion corresponding to the high concentration P-type impurity diffusion area 34 so that a light enters only the photodiode section 30a; and further, an interlayer insulation film 44 and a BPSG film 45 are formed on the entire surface thereabove as a planarization film.

Next, a method for manufacturing the solid-state image capturing apparatus according to Embodiment 1 will be described.

First, the P-type semiconductor well area 32 is formed on the semiconductor substrate 31 as illustrated in FIG. 1(a). Further, an insulation film, such as a $SiO_2$ film 39, is formed on the surface of the P-type semiconductor well area 32.

Next, an N-type impurity and a P-type impurity are selectively implanted into each predetermined area in the P-type semiconductor well area 32, so that a P-type semiconductor area 35 functioning as a readout gate area, a channel stop area 38, a P-type semiconductor active area 36, and an N-type semiconductor active area 37 in a layer thereabove are respectively formed, the areas 36 and 37 constituting an electric charge transfer area between the areas 35 and 38. The order can be arbitrary for forming the electric charge transfer area, the channel stop area, and the readout gate area.

For example, a case will be described where the P-type semiconductor active area 36 and the N-type semiconductor active area 37, which constitute the electric charge transfer area, are formed as a first impurity implantation area (impurity diffusion area), and subsequently, the channel stop area 38 is formed as the second impurity implantation area (impurity diffusion area), and further, P-type semiconductor area 35 constituting the readout gate area is formed as a third impurity implantation area (impurity diffusion area).

As described above, after the P-type semiconductor well area 32 is formed on the N-type silicon substrate 31 and an insulation film, such as the $SiO_2$ film 39, is formed on the surface of the P-type semiconductor well area 32, a positive type resist film R1 is applied on the entire surface and the positive type resist film R1 is exposed by an exposure apparatus with a Krf excimer laser ($\lambda$=248 nm) as the light source. Subsequently, the exposed portion of the positive type resist film R1 is removed with a developing solution to form a resist mask having a predetermined pattern of an opening R1a as a first impurity implantation protection film (impurity implantation mask) Herein, the positive type resist film R1 is constituted of a chemical amplification type resist, and the chemical amplification type resist includes a photo-acid-generating agent in which iodine (chemical symbol: I) is not the constituent atom. In addition, the positive type resist film R1 is formed by forming the chemical amplification type resist with the thickness of 3000 to 80000 Å, and preferably, with the thickness of 8000 to 20000 Å.

Specifically, the resist film R1 is a photoresist film, whose pattern layout is considered to be able to form a pattern and which is considered so as to obtain a desired resist pattern and which does not include onium salt, such as iodonium salt that includes iodine. For example, the resist film R1 is a photo resist film that is adjusted by a photo-acid-generating agent including onium salt, such as sulfonium salt. However, for the resist film R1, in order to obtain a desired resist pattern, it is also possible to use a photoresist that is combined with iodonium salt as onium salt with a different kind of a photo-acid-generating agent as a base at a minimum ratio to obtain the desired resist pattern by the exposure using the Krf excimer laser. That is, in this Embodiment, although the resist material constituting the impurity implantation mask is a resist material that is obtained by replacing all of iodonium salt contained in a chemical amplification type resist, the chemical amplification type resist containing iodonium salt, which is a photo-acid-generating agent, of the content determined based on at least the wavelength of an exposure light and the film thickness of the resist mask, with a photo-acid-generating agent which does not contain iodine, the resist material constituting the impurity implantation mask may be a resist material that is obtained by replacing at least a portion of iodonium salt contained in a chemical amplification type resist, the chemical amplification type resist containing iodonium salt, which is a photo-acid-generating agent, of the content determined based on at least the wavelength of an exposure light and the film thickness of the resist mask with a photo-acid-generating agent which does not contain iodine. In addition, the chemical amplification type resist may be such that the content of the photo-acid-generating agent is determined based on the inclining angle of a resist side surface in the resist opening, in addition to the wavelength of an exposure light and the film thickness of the resist mask.

Subsequently, using the positive type resist film R1 as an impurity implantation film, the implantation of a P-type impurity and an N-type impurity is performed, and the P-type semiconductor active area 36 and the N-type semiconductor active area 37, which constitute the electric charge transfer section (vertical CCD) 30b, are formed as the first impurity implantation area.

Next, as illustrated in FIG. 1(b), the channel stop area 38 is formed as the second impurity implantation area different from the first impurity implantation area.

That is, after removing the resist film R1 described above, a positive type resist film R2 is applied on the entire surface of the P-type semiconductor well area 32, and the resist film R2 is exposed by an exposure apparatus with a Krf excimer laser ($\lambda$=248 nm) as a light source. Subsequently, the exposed portion of the positive type resist film R2 is removed with a developing solution, and a resist mask R2 having a predetermined pattern of an opening R2a is formed as a second impurity implantation protection film (impurity implantation mask). Herein, the positive type resist film R2 is constituted of a chemical amplification type resist, as similar to the positive type resist film R1 described above, and this chemical amplification type resist includes a photo-acid-generating agent in which iodine (chemical symbol: I) is not the constituent atom. In addition, the positive type resist film R2 is formed by forming the chemical amplification type resist with the thickness of 3000 to 80000 Å, and preferably, with the thickness of 8000 to 20000 Å.

Specifically, the resist film R2 is similar to the resist film R1 described above, That is, the resist film R2 is a photoresist film, whose pattern layout is considered to be able to form a pattern and which is considered so as to obtain a desired resist pattern and which does not include onium salt, such as iodonium salt that includes iodine. For example, the resist film R2 is a photo resist film that is adjusted by a photo-acid-generating agent including onium salt, such as sulfonium salt. However, for the resist film R2, in order to obtain a desired resist pattern, it is also possible to use a photoresist that is combined with iodonium salt as onium salt with a different kind of a photo-acid-generating agent as a base at a minimum ratio to obtain the desired resist pattern by the exposure using the Krf excimer laser.

Next, as illustrated in FIG. 1(c), the P-type semiconductor area 35, which will be a readout gate area, is formed as a third impurity implantation area different from the first and second impurity implantation areas.

That is, after removing the resist film R2 described above, a positive type resist film R3 is applied on the entire surface of the P-type semiconductor well area 32, and the resist film R3 is exposed by an exposure apparatus with an KrF excimer laser ($\lambda$=248 nm) as a light source. Subsequently, the exposed portion of the positive type resist film R3 is removed with a developing solution, and a resist mask R3 having a predetermined pattern of an opening R3a is formed as a second impurity implantation protection film (impurity implantation mask). Herein, the positive type resist film R3 is constituted of a chemical amplification type resist, as similar to the positive type resist films R1 and R2 described above, and this chemical amplification type resist includes a photo-acid-generating agent in which iodine (chemical symbol: I) is not the constituent atom. In addition, the positive type resist film R3 is formed by forming the chemical amplification type resist with the thickness of 3000 to 80000 Å, and preferably, with the thickness of 8000 to 20000 Å.

Specifically, the resist film R3 is similar to the resist films R1 and R2 described above, That is, the resist film R3 is a photoresist film, whose pattern layout is considered to be able to form a pattern and which is considered so as to obtain a desired resist pattern and which does not include onium salt, such as iodonium salt that includes iodine. For example, the resist film R3 is a photo resist film that is adjusted by a photo-acid-generating agent including onium salt, such as sulfonium salt. However, for the resist film R3, in order to obtain a desired resist pattern, it is also possible to use a photoresist that is combined with iodonium salt as onium salt with a different kind of a photo-acid-generating agent as a base at a minimum ratio to obtain the desired resist pattern by the exposure using the Krf excimer laser.

Subsequently, the resist film R3 is removed as illustrated in FIG. 2(a), and subsequently, an insulation film, such as $Si_3N_4$ film, is layered on the entire surface of the $SiO_2$ film 39 as illustrated in FIG. 2(b). Subsequently, a portion corresponding to a location area for the photodiode section, which will be a light receiving section, in the $Si_3N_4$ film is selectively removed by etching as illustrated in FIG. 2(c). The $Si_3N_4$ film that remains after the etching will be a $Si_3N_4$ film 40, which is positioned directly below an electric charge transfer electrode formed thereafter. Subsequently, an electric charge transfer electrode 41 is formed on the $Si_3N_4$ film 40, and an interlayer insulation film 42 is formed thereon in such a manner to cover the electric charge transfer electrode 41.

Next, as illustrated in FIG. 3(a), using a fourth impurity implantation protection film R4, phosphor or arsenic, for example, is implanted as an N-type impurity to form an N-type impurity diffusion area 33 of the photodiode section (photoelectric conversion section) having a predetermined depth.

That is, the positive type resist film R4 is applied on the interlayer insulation film 42 and the insulation film 39, and the positive type resist film R4 is exposed by an exposure apparatus with Krf excimer laser (λ=248 nm) as a light source. Subsequently, the exposed portion of the positive type resist film R4 is removed with a developing solution to form a resist mask having a predetermined pattern of an opening R4a as a fourth impurity implantation protection film (impurity implantation mask). Herein, the positive type resist film R4 is constituted of a chemical amplification type resist, as similar to the positive type resist films R1 to R4 described above, and this chemical amplification type resist includes a photo-acid-generating agent in which iodine (chemical symbol: I) is not the constituent atom. In addition, the positive type resist film R4 is formed by forming the chemical amplification type resist with the thickness of 3000 to 80000 Å, and preferably, with the thickness of 20000 to 40000 Å.

Specifically, the resist film R4 is similar to the resist films R1 to R3 described above. That is, the resist film R4 is a photoresist film, whose pattern layout is considered to be able to form a pattern and which is considered so as to obtain a desired resist pattern and which does not include onium salt, such as iodonium salt that includes iodine. For example, the resist film R4 is a photo resist film that is adjusted by a photo-acid-generating agent including onium salt, such as sulfonium salt. However, for the resist film R4, in order to obtain a desired resist pattern, it is also possible to use a photoresist that is combined with iodonium salt as onium salt with a different kind of a photo-acid-generating agent as a base at a minimum ratio to obtain the desired resist pattern by the exposure using the Krf excimer laser.

In this Embodiment, although the fourth impurity implantation protection film R4 is used to form the photodiode section (photoelectric conversion section), the photodiode section (photoelectric conversion section) may be formed by using the electric charge transfer electrode as a part of the impurity implantation mask. In addition, the first to fourth impurity implantation areas, namely, the electric charge transfer area, the channel stop area, the readout gate area, and the photodiode section (photoelectric conversion section), can be formed in an arbitrary order.

Further, boron, for example, is implanted using the fourth resist film R4 described above as a mask, a high concentration P-type impurity diffusion area 34 of the photodiode section (photoelectric conversion section) is formed as a surface layer on the N-type impurity diffusion area 33. The photoelectric conversion section of the light receiving section is constituted by the p-n junction of the N-type impurity diffusion area 33 and the P-type semiconductor well area 32 as well as the p-n junction of the N-type impurity diffusion area 33 and the high concentration P-type impurity diffusion area 34.

The high concentration P-type impurity diffusion area 34 may be formed by implanting an impurity using an impurity implantation protection film (impurity implantation mask) different from the case of the N-type impurity diffusion area 33 described above. That is, in addition, after removing the resist film R4, which is the fourth impurity implantation protection film R4 described above, the positive type resist film (not shown) similar to the resist film R4 described above is applied on the entire surface of the P-type semiconductor well area 32 and is exposed with a desired pattern, and further, the exposed portion is removed by a developing solution, so as to form a resist mask having a predetermined pattern of a mask and to form the high concentration P-type impurity diffusion area 34 by implanting an impurity using the resist mask as an impurity implantation protection film (impurity implantation mask).

Further, the fourth resist film R4 is removed as illustrated in FIG. 3(b), light shielding film 43, which is constituted of a tungsten (W) film and s titanium (Ti) film, is formed on the interlayer insulation film 42 covering the electric charge transfer electrode 41, as illustrated in FIG. 3(c), in such a manner that the light shielding film opening is located so as to receive a light in the high concentration P-type impurity diffusion area 34.

The interlayer insulation film 44 and a BPSG film 45 constituted of PSG (phosphor silicate glass) and the like, the films being as a planarization film, are formed in this order on the entire surface of the substrate section where the light shielding film 43 is formed, and a microlens, color filter and the like (not shown) are formed so as to manufacture the CCD type solid-state image capturing apparatus 50 according to the Embodiment.

According to the present Embodiment as described above, when the impurity implantation area 33 where the photodiode section (photoelectric conversion section) is formed and the impurity implantation area, such as the channel stop section 38, adjacent to the photodiode section (photoelectric conversion section) is formed, a photoresist which does not include a photo-acid-generating agent using iodonium salt as onium salt is selected as an impurity implantation preventing film, so that the damage to the atom configuration due to the penetration of iodine is reduced in the vicinity of the boarder of the photodiode section (photoelectric conversion section) in the substrate, and as a result, it is possible to effectively prevent white defects and dark current from occurring to improve the yield rate of the solid-state image capturing apparatus.

Hereinafter, the evaluation result will be described with regard to the white defects that depend on the content of iodine.

Figure 4:
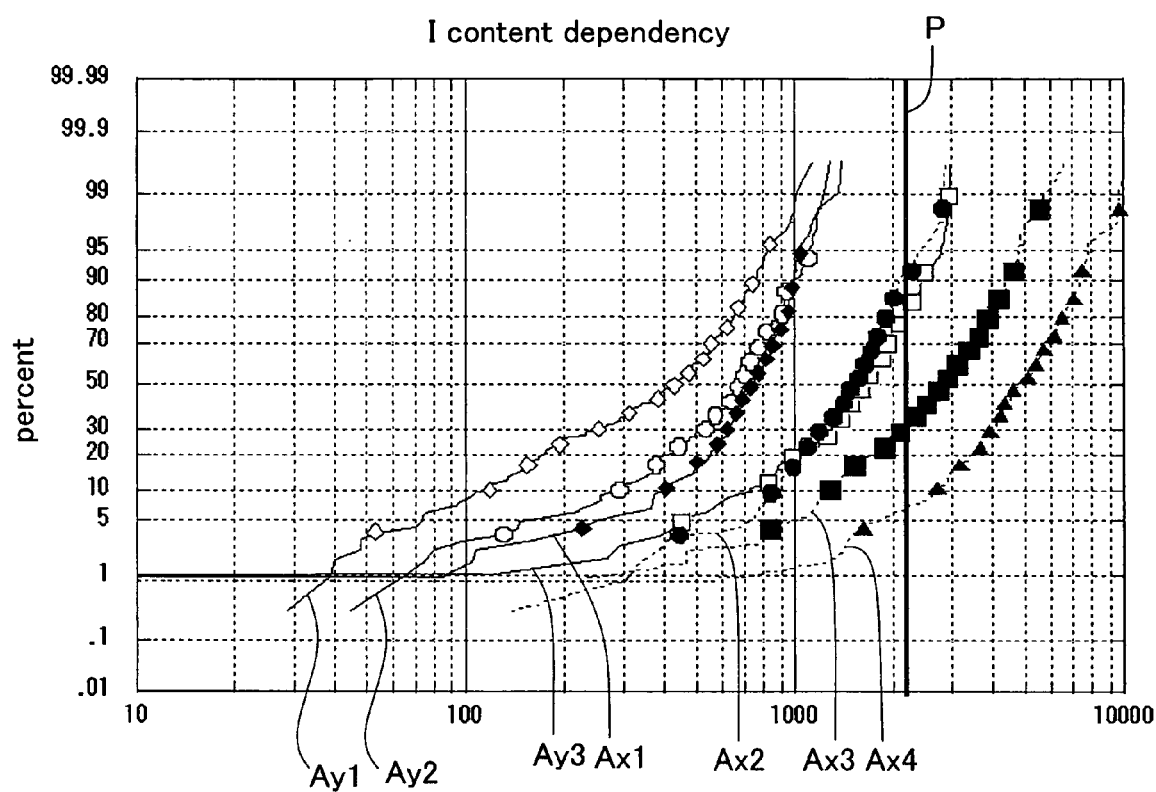
FIG. 4 is a diagram for describing an effect of a method for manufacturing a solid-state image capturing apparatus according to Embodiment 1, illustrating the distribution of the number of white defects where a plurality of solid-state image capturing chips (solid-state image capturing apparatus) included in a wafer are placed in order with the small number of white defects, with the content ratio of iodonium salt with respect to the reference resist as a parameter.

FIG. 4 illustrates the distribution of the number of white defects, where a plurality of solid-state image capturing chips (solid-state image capturing apparatus) included in a wafer are placed in order with the small number of white defects, with the content ratio of iodonium salt with respect to the reference resist as a parameter.

That is, the axis of ordinates illustrates the ratio of the number of the white defects of individual chips with respect to the intermediate value between the minimum number of the white defects of the chip with the least white defects and the maximum number of the white defects of the chip with the most white defects. Also, the axis of abscissas illustrates the number of white defects of individual chips in an arbitrary unit.

The graph Ay3, where the measurement points are illustrated by white squares, illustrates the distribution of the number of white defects in a case where a reference resist commonly used among the second chemical amplification type resists (Y resists) is used for the manufacturing of a solid-state image capturing apparatus.

The graph Ay2, where the measurement points are illustrated by white circles, illustrates the distribution of the number of white defects in a case where a resist obtained by replacing ⅞ or more of iodonium salt contained in the reference resist of the second chemical amplification type resists (Y resists) with a photo-acid-generating agent that does not contain iodine, is used for the manufacturing of a solid-state image capturing apparatus.

The graph Ay1, where the measurement points are illustrated by white diamonds, illustrates the distribution of the number of white defects in a case where a resist obtained by replacing all the iodonium salt contained in the reference resist of the second chemical amplification type resists (Y resists) with a photo-acid-generating agent that does not contain iodine, is used for the manufacturing of a solid-state image capturing apparatus.

In addition, the graph Ax3, where the measurement points are illustrated by black squares, illustrates the distribution of the number of white defects in a case where a reference resist commonly used among the first chemical amplification type resists (X resists) different from the material of the second chemical amplification type resists (Y resists) is used for the manufacturing of a solid-state image capturing apparatus.

The graph Ax2, where the measurement points are illustrated by black circles, illustrates the distribution of the number of white defects in a case where a resist obtained by replacing ½ or more of iodonium salt contained in the reference resist of the first chemical amplification type resists (X resists) with a photo-acid-generating agent that does not contain iodine, is used for the manufacturing of a solid-state image capturing apparatus.

The graph Ax1, where the measurement points are illustrated by black diamonds, illustrates the distribution of the number of white defects in a case where a resist obtained by replacing all the iodonium salt contained in the reference resist of the first chemical amplification type resists (X resists) with a photo-acid-generating agent that does not contain iodine, is used for the manufacturing of a solid-state image capturing apparatus.

The graph Ax4, where the measurement points are illustrated by black triangles, illustrates the distribution of the number of white defects in a case where a resist that contains iodonium salt 1.75 times the amount of iodonium salt contained in the reference resist of the first chemical amplification type resists (X resists), is used for the manufacturing of a solid-state image capturing apparatus.

Herein, the brightness of the white defects as the target of the evaluation is defined to be the brightness in the brightest area of the three areas into which the range of 0 mV to 2.0 mV is divided.

Further, when the reference for judging a solid-state image capturing chip to be a good quality is set, for example, to be about 2000 white defects of the relative number, a chip in which the evaluation point is positioned on the right side of the boarder line P is judged to be inferior. Due to this, a wafer in which all the chips are judged to have a good quality, is manufactured by using the resist that satisfies the condition to obtain the white defect distribution shown in the graphs Ay1, Ay2 and Ax1.

Additionally, when the reference for judging a solid-state image capturing chip to be a good quality is set to be about 3000 white defects of the relative number, a wafer in which all the chips are judged to have a good quality, is manufactured by using the resist that satisfies the condition to obtain the white defect distribution shown in the graphs Ay1, Ay2, Ay3, Ax1 and Ax2.

Figure 5:
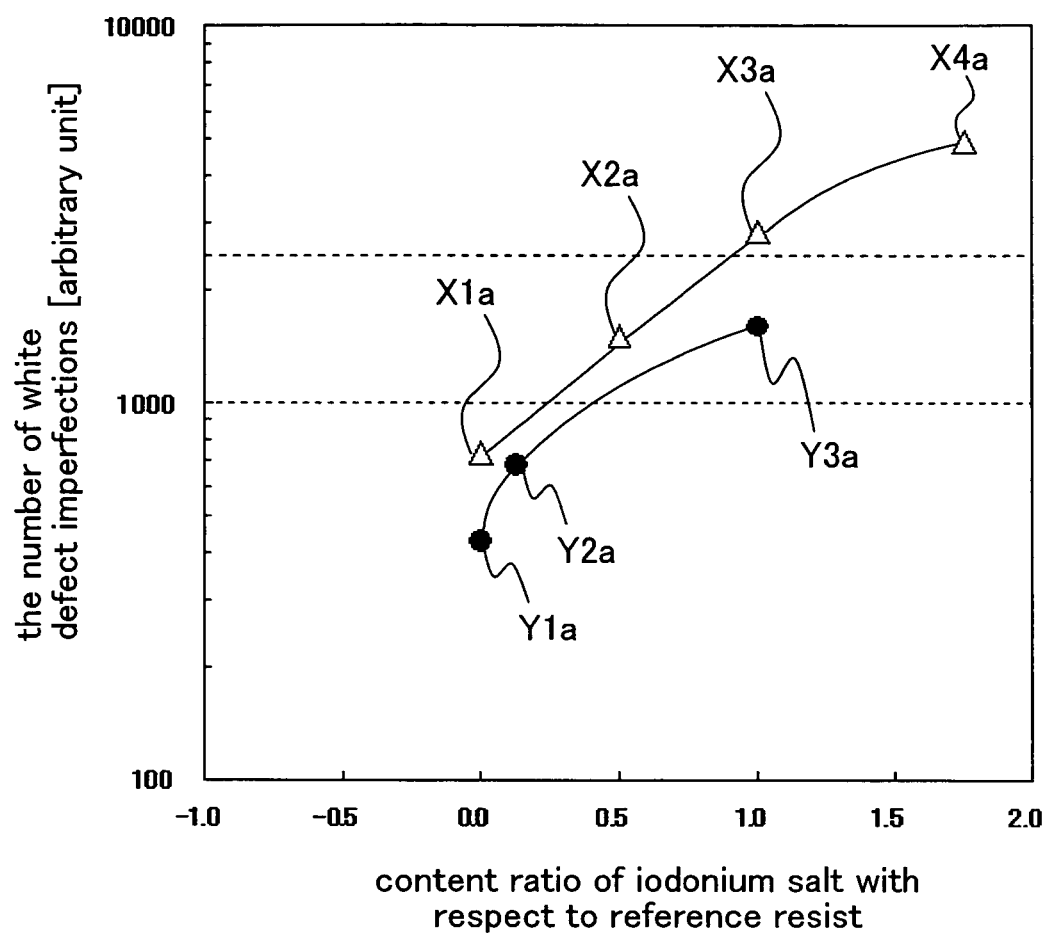
FIG. 5 is a diagram for describing an effect of a method for manufacturing a solid-state image capturing apparatus according to Embodiment 1, illustrating the correlation between the content ratio of onium salt as iodonium salt mixed in a photoresist and the number of white defect imperfections in a graph.
Figure 6:
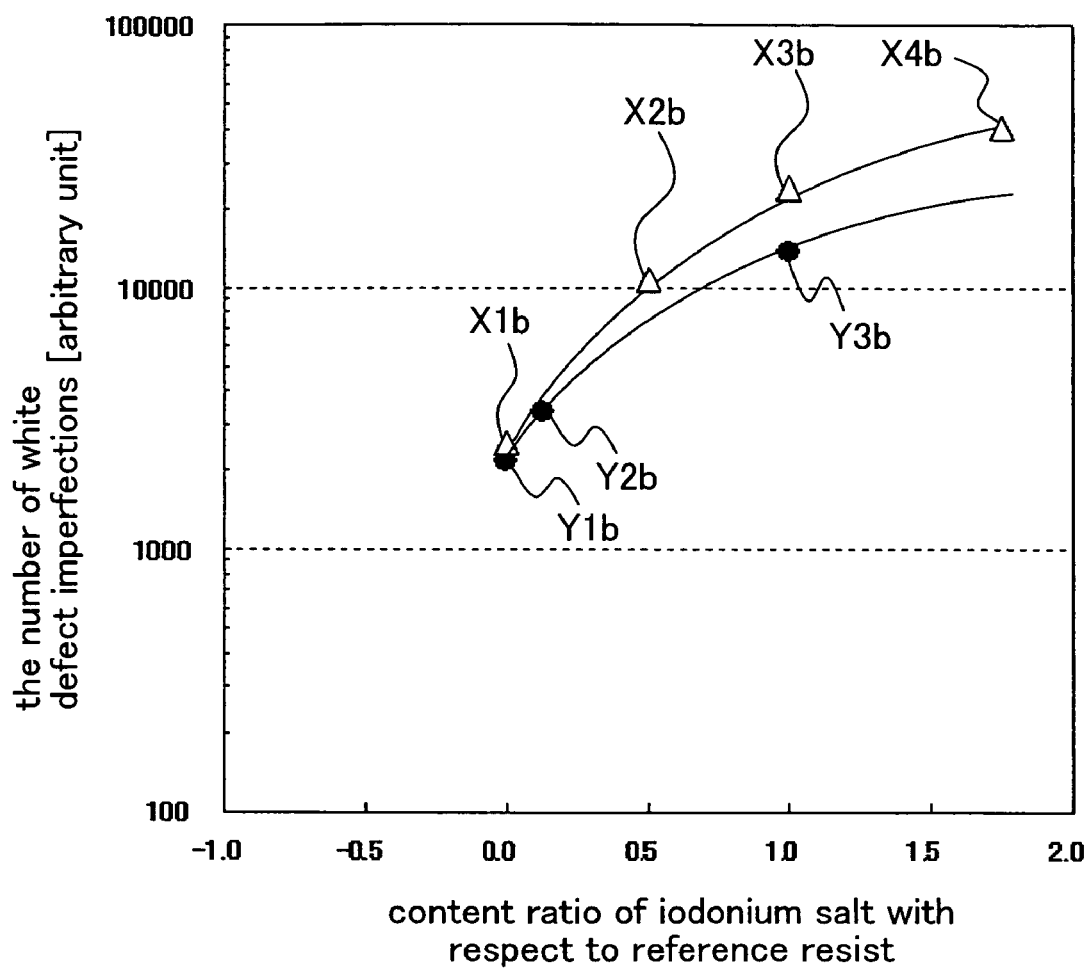
FIG. 6 is a diagram for describing an effect of a method for manufacturing a solid-state image capturing apparatus according to Embodiment 1, illustrating the correlation between the content ratio of onium salt as iodonium salt mixed in a photoresist and the number of white defect imperfections in a graph.
Figure 7:
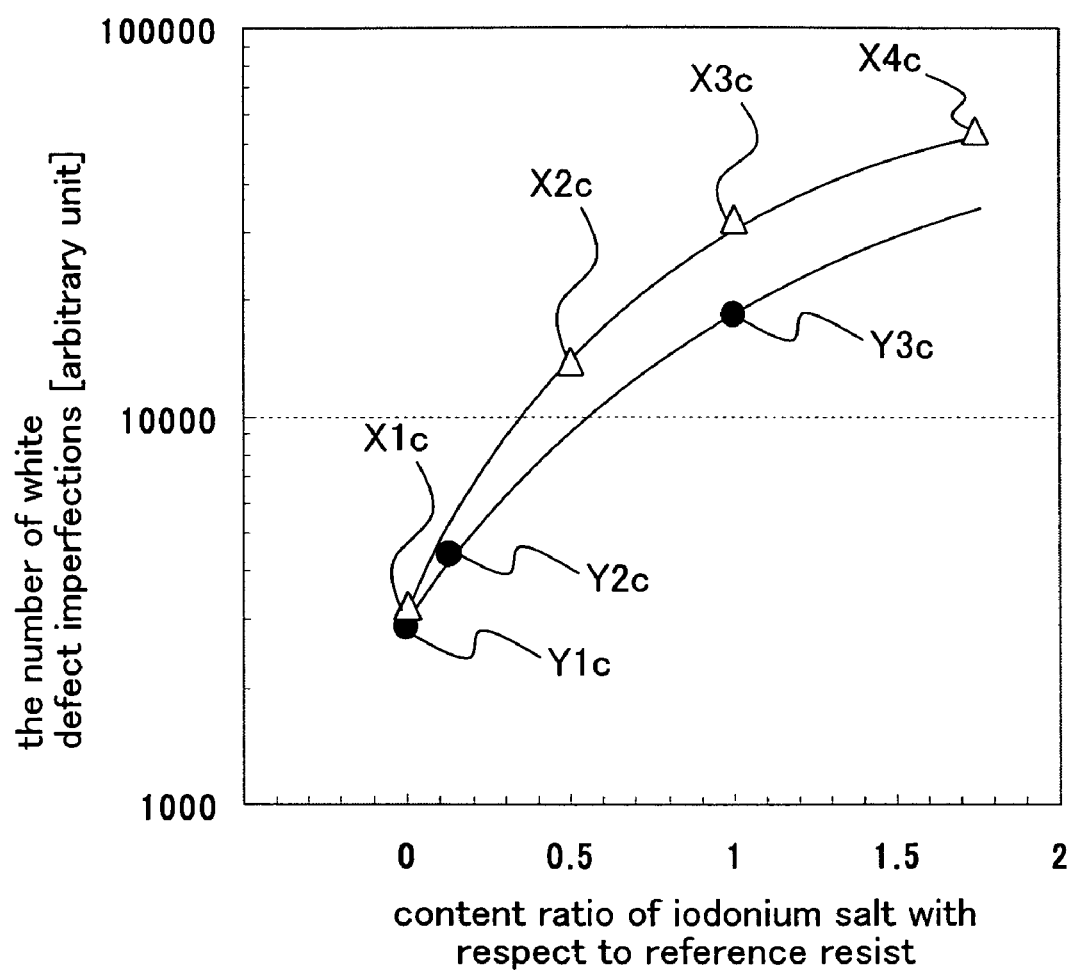
FIG. 7 is a diagram for describing an effect of a method for manufacturing a solid-state image capturing apparatus according to Embodiment 1, illustrating the correlation between the content ratio of onium salt as iodonium salt mixed in a photoresist and the number of white defect imperfections in a graph.
Figure 8:
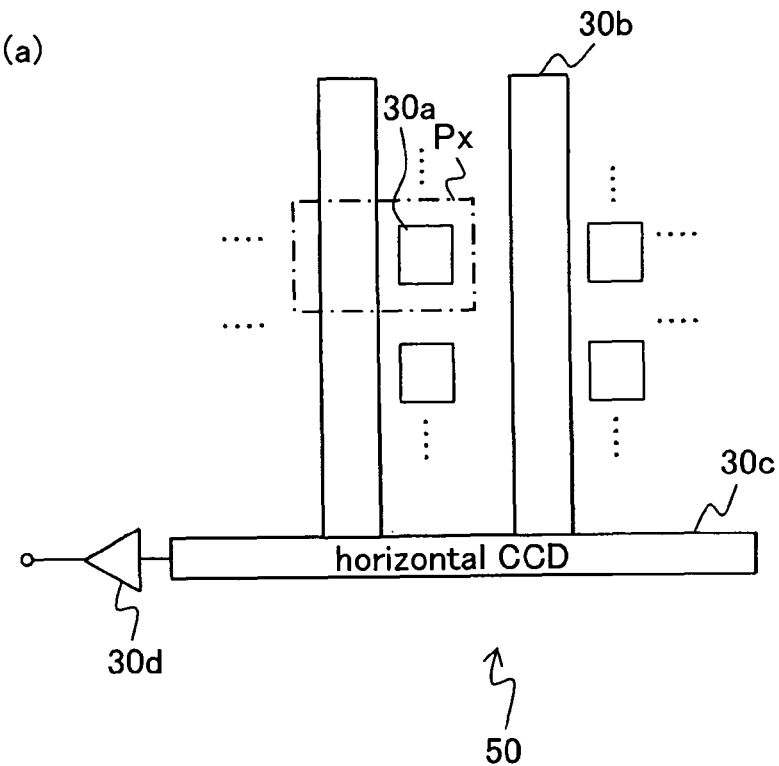
FIG. 8 is a diagram for describing a conventional CCD image sensor, where FIG. 8(a) schematically illustrates the configuration of the CCD image sensor
Figure 8:
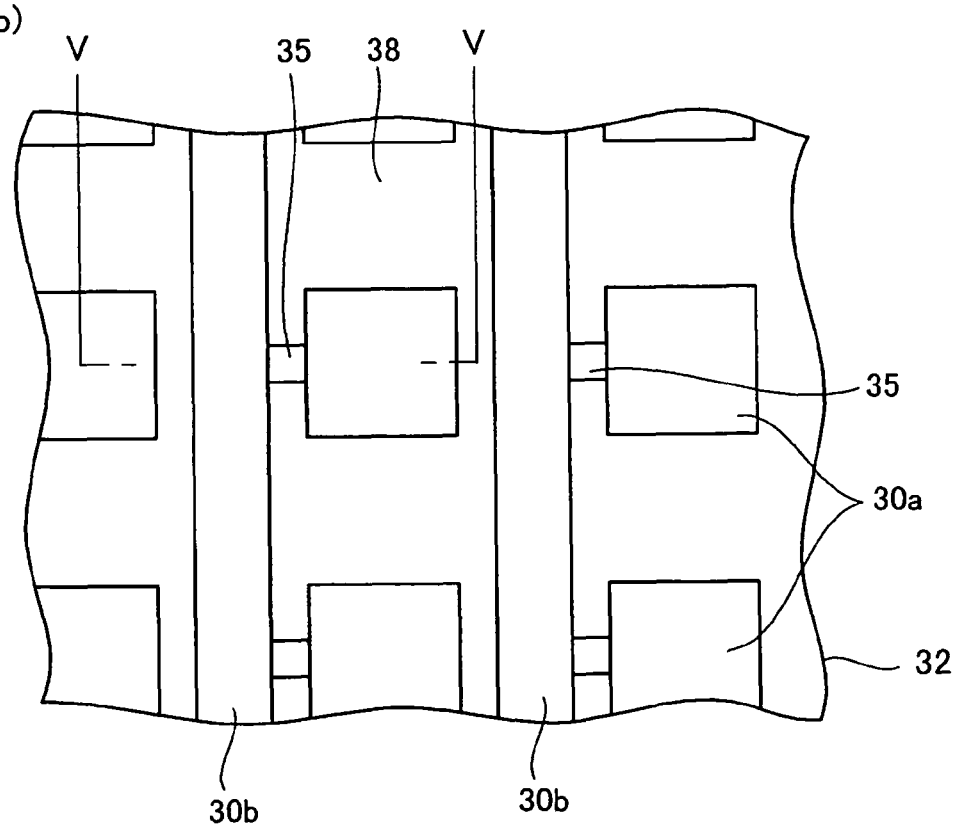
Figure 9:
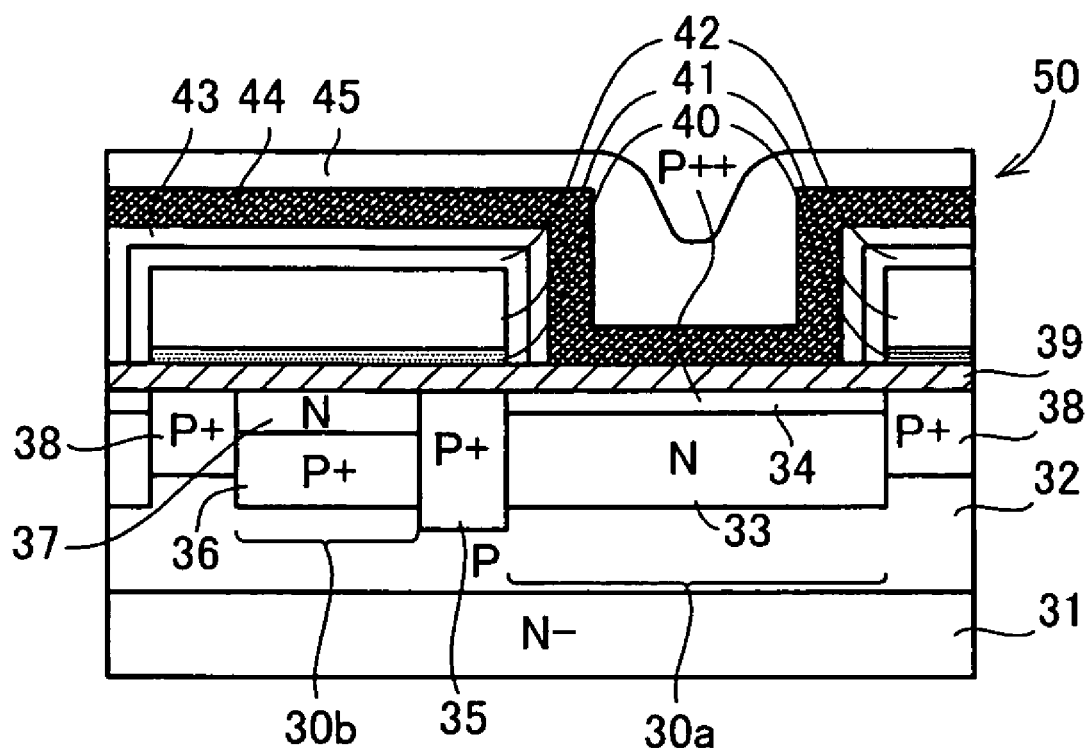
FIG. 9 is a cross sectional view for describing a conventional CCD image sensor, illustrating a cross sectional structure along the line V-V in FIG. 8(b).
Figure 10:
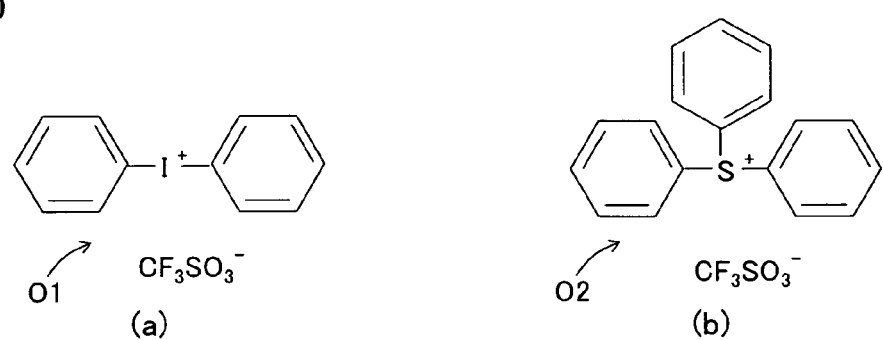
FIG. 10 is a diagram illustrating iodonium salt O1 (FIG. 10(a)) and sulfonium salt O2 (FIG. 10(b)) as onium salt, which are representative photo-acid-generating agents.
Figure 11:
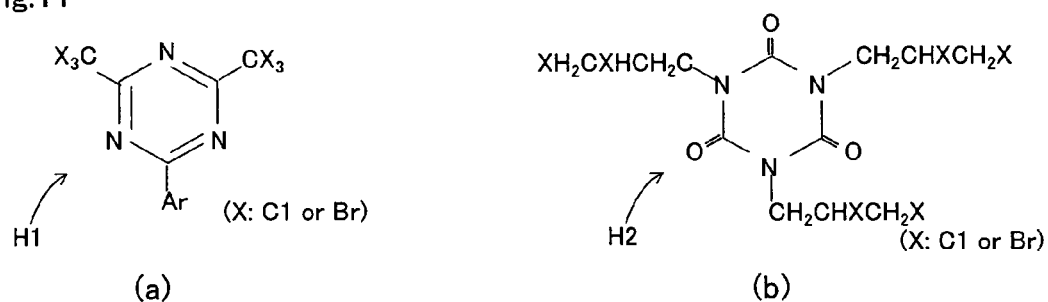
FIG. 11 is a diagram illustrating a halogen compound H1 (FIG. 11(a)) and a halogen compound H2 (FIG. 11(b)) as representative photo-acid-generating agents.
Figure 12:
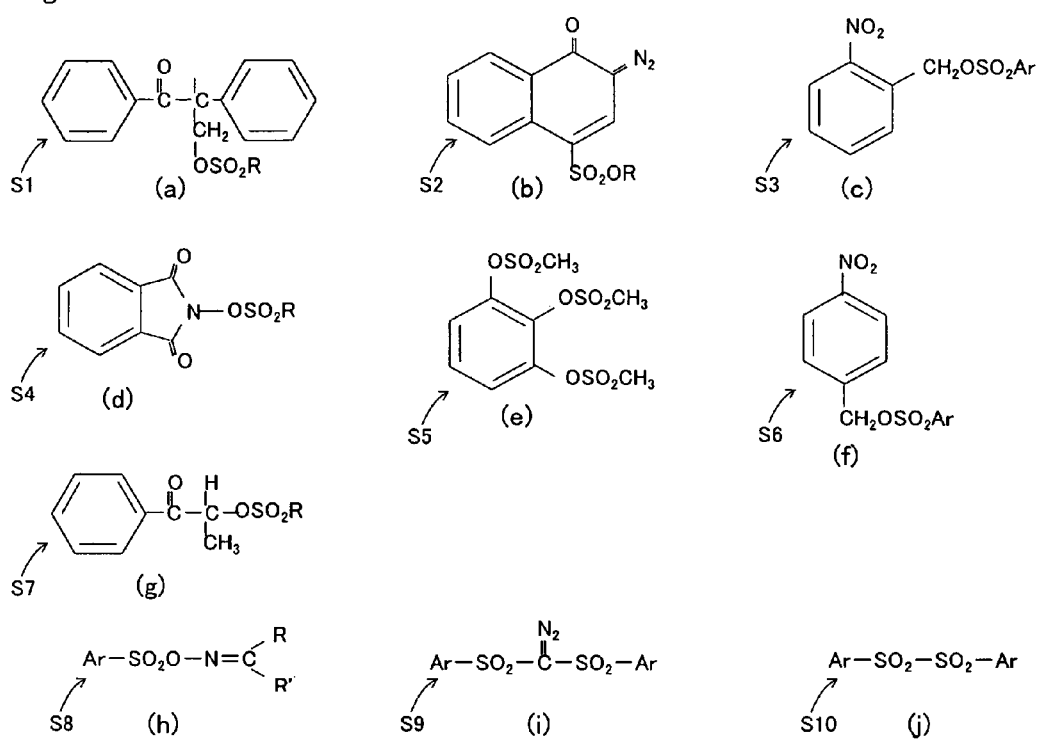
FIG. 12 is a diagram illustrating sulfonate acid ester S1 to S10 (FIGS. 12(a) to (j)) as specific examples of representative photo-acid-generating agents.
Figure 13:
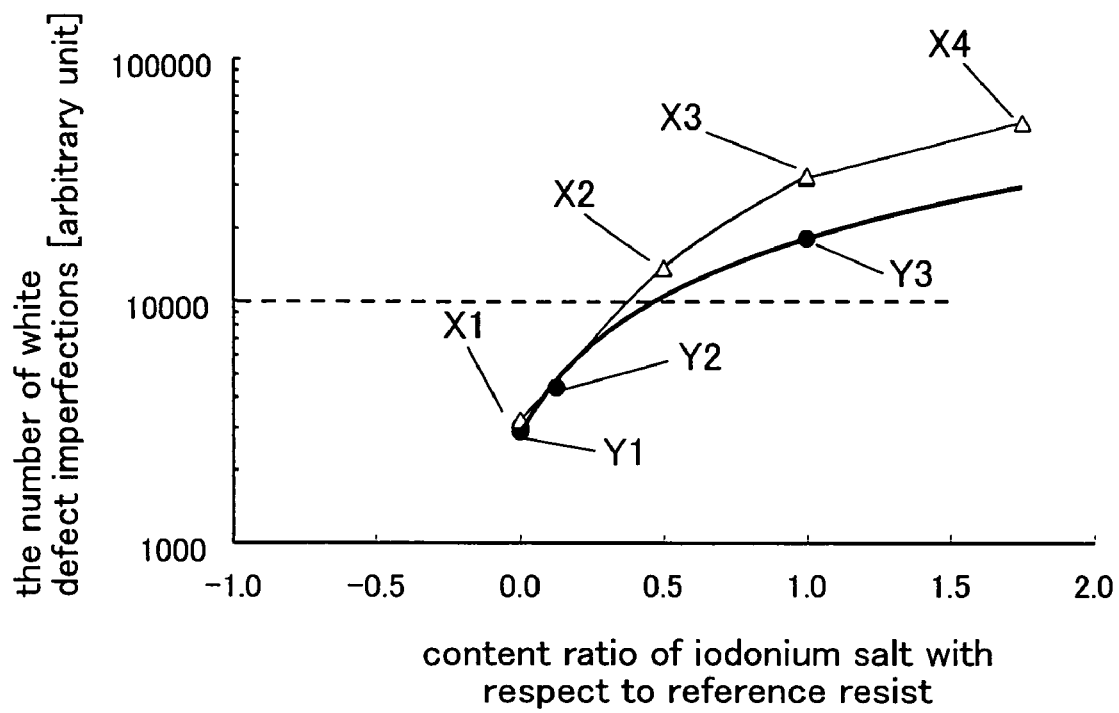
FIG. 13 is a diagram relatively illustrating the correlation between the content ratio of onium salt as iodonium salt mixed in a photoresist and the number of white defect imperfections in a graph.
Figure 14:
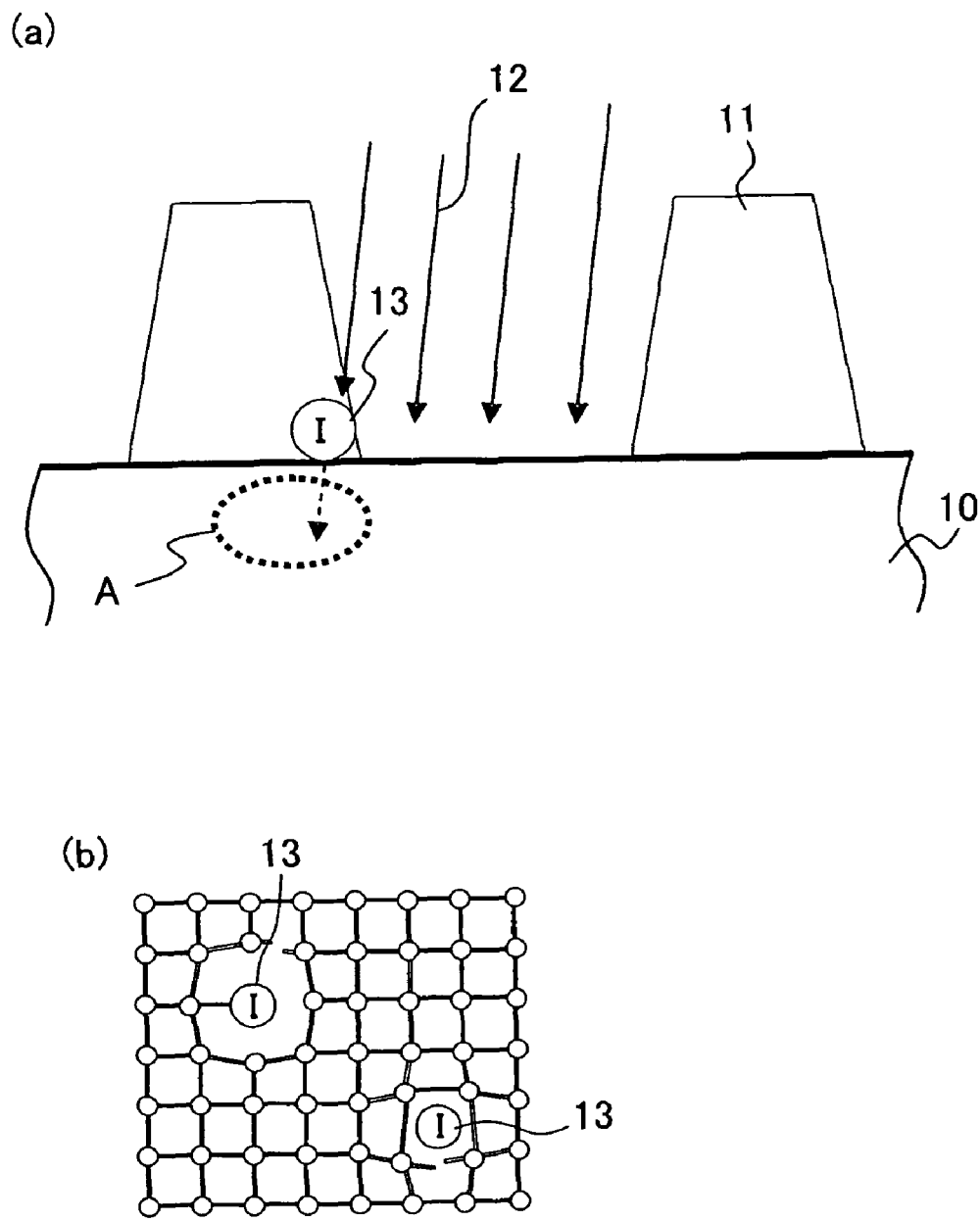
FIG. 14 is a schematic view for describing the mechanism of the occurrence of the white defects described above, illustrating a state in which the iodine atoms are implanted into a photodiode section in a substrate (FIG. 14(a)) and a state in which an atom configuration in a photodiode section is damaged by iodine atoms (FIG. 14(b)).

FIGS. 5 to 7 relatively illustrate, by using an arbitral unit, the number of white defects occurred (axis of ordinates) with respect to the content ratio of iodonium salt in a chemical amplification type resist used as an impurity implantation mask (axis of abscissas), with regard to two kinds of chemical amplification type resists.

Herein, FIG. 5 uses, as the evaluation target, white defects included in the brightest area of the three areas into which the range of 0 mV to 2.0 mV is divided, and FIG. 5 relatively illustrates, by using an arbitral unit, the number of white defects occurred (axis of ordinates) with respect to the content ratio of iodonium salt in a chemical amplification type resist used as an impurity implantation mask of iodine (axis of abscissas), with regard to two kinds of chemical amplification type resists (i.e., X resist and Y resist).

That is, measurement points X1a to X4a denote the number of white defects occurred with respect to the content ratio of iodonium salt in a first chemical amplification type resist (X resist), and measurement points Y1a to Y3a denote the number of white defects occurred with respect to the content ratio of iodonium salt in a second chemical amplification type resist (Y resist) different from the first chemical amplification type resist.

In the axis of abscissas illustrated in FIG. 5, the content ratio of iodonium salt in a generally-used chemical amplification type resist, which is used as a reference for the comparison (also referred to as reference resist, hereinafter) is defined to be 1.0. For example, it is indicated that in the resist indicated by this content ratio value (1.5), the content ratio of the iodonium salt is 1.5 times the content ratio of the iodonium salt in the reference resist; and it is indicated that in the resist indicated by this content ratio value (0.0), the content ratio of the iodonium salt is 0 times the content ratio of the iodonium salt in the reference resist, that is iodonium salt is not contained. Further, the number of white defects that have occurred and denoted by using an arbitrary unit represents the relative number between the measurement points listed here. For example, it is indicated that the number of white defects of the resist that corresponds to the measurement point X1a is about 700.

FIG. 6 uses, as the evaluation target, white defects included in the area having the middle brightness of the three areas into which the range of 0 mV to 2.0 mV is divided, and FIG. 6 relatively illustrates, by using an arbitral unit, the number of white defects occurred (axis of ordinates) with respect to the content ratio of iodonium salt in a chemical amplification type resist used as an impurity implantation mask of iodine (axis of abscissas), with regard to two kinds of chemical amplification type resists (i.e., X resist and Y resist).

Measurement points X1b to X4b denote the number of white defects occurred with respect to the content ratio of iodonium salt in a first chemical amplification type resist (X resist), and measurement points Y1b to Y3b denote the number of white defects occurred with respect to the content ratio of iodonium salt in a second chemical amplification type resist (Y resist) different from the first chemical amplification type resist.

Further, FIG. 7 uses, as the evaluation target, white defects included in the area having the darkest brightness of the three areas into which the range of 0 mV to 2.0 mV is divided, and FIG. 7 relatively illustrates, by using an arbitral unit, the number of white defects occurred (axis of ordinates) with respect to the content ratio of iodonium salt in a chemical amplification type resist used as an impurity implantation mask of iodine (axis of abscissas), with regard to two kinds of chemical amplification type resists (i.e., X resist and Y resist).

Measurement points X1c to X4c denote the number of white defects occurred with respect to the content ratio of iodonium salt in a first chemical amplification type resist (X resist), and measurement points Y1 to Y3c denote the number of white defects occurred with respect to the content ratio of iodonium salt in a second chemical amplification type resist (Y resist) different from the first chemical amplification type resist.

Note that the axis of abscissas and axis of ordinates of the coordinates shown in FIGS. 6 and 7 are the same as the axis of abscissas and axis of ordinates of the coordinates shown in FIG. 5. In addition, in FIGS. 5 to 7, the number of white defects corresponding to each measurement point is defined to correspond to the median value in the distribution of the number of white defects illustrated in each graph of FIG. 4.

The content ratio of iodonium salt in which the number of white defects of the reference resist is reduced by half is considered to be one of the standards, and the ratio is determined for replacing iodonium salt of the reference resist with a photo-acid-generating agent that does not include iodine in view of the number of white defects at the measurement points shown in FIGS. 5 to 7. It is needless to say that the reference resist herein is a chemical amplification type resist that includes iodonium salt as a photo-acid-generating agent with an amount determined based on at least the wavelength of the exposure light and the film thickness of the resist mask.

For example, it can be seen from FIG. 5 that it is desirable to replace at least ½ or more of iodonium salt included in the reference resist with a photo-acid-generating agent that does not include iodine.

In particular, it can be seen that it is desirable to replace ⅞ or more of iodonium salt included in the reference resist with a photo-acid-generating agent that does not include iodine in order to reduce the number of white defects of the reference resist in half with regard to both X resist and Y resist.

In addition, it can be seen from FIG. 6 that it is possible to replace at least ½ or more of iodonium salt included in the reference resist with a photo-acid-generating agent that does not include iodine in order to reduce the number of white defects of the reference resist in half with regard to both X resist and Y resist.

In addition, it can be seen from FIG. 7 that it is possible to replace at least ½ or more of iodonium salt included in the reference resist with a photo-acid-generating agent that does not include iodine in order to reduce the number of white defects of the reference resist in half with regard to both X resist and Y resist. In particular, it is possible to replace ⅞ or more of iodonium salt included in the reference resist with a photo-acid-generating agent that does not include iodine in order to reduce the number of white defects of the reference resist as much as 1/10 the amount with regard to both X resist and Y resist.

As described above, by replacing iodonium salt in a chemically amplification type resist commonly used in the manufacturing of a solid-state image capturing apparatus with a photo-acid-generating agent that does not include iodine, the number of white defects can be reduced in a solid-state image capturing apparatus that is manufactured using such a resist.

In the embodiment described above, a resist mask in which the amount of a photo-acid-generating agent that includes iodine is restricted is used in forming the impurity implantation area other than the impurity implantation area that constitutes the photodiode; however, it is also allowed to use such a resist mask in which the amount of a photo-acid-generating agent that includes iodine is restricted, only in forming the impurity implantation area that constitutes the photodiode. In addition, it is also allowed to use a resist mask in which the amount of a photo-acid-generating agent that includes iodine is restricted as needed for the forming of each of the impurity implantation areas in forming the impurity implantation area other than the impurity implantation area that constitutes the photodiode.

In addition, in the embodiment described above, it has been described that a resist mask is used as an impurity implantation preventing layer used in forming an impurity implantation area that constitutes a photodiode section (photoelectric conversion section); however, it is also possible to use an insulation hard mask formed of an insulation material, such as a silicon oxide film and a silicon nitride film, as the impurity implantation preventing layer.

Hereinafter, a method is briefly described for manufacturing a solid-state image capturing apparatus, using an insulation hard mask as an impurity implantation preventing layer.

First, an insulation film, which is formed of either a silicon oxide film or a silicon nitride film, is formed in a surface area of a semiconductor substrate when an impurity implantation area that constitutes a photodiode section (photoelectric conversion section) is formed in the surface area of the semiconductor substrate. Next, the insulation film is patterned by a resist mask to form an insulation hard mask for preventing impurity implantation. Subsequently, a selective impurity implantation is performed using the insulation hard mask.

In this case, the penetration of iodine can be avoided from the impurity implantation preventing layer into the photodiode section (photoelectric conversion section), thereby preventing the occurrence of white defects and dark current due to the penetration of iodine into the photodiode section (photoelectric conversion section) to improve the yield rate of the solid-state image capturing apparatus.

In addition, in Embodiment 1 described above, a CCD type image sensor is mentioned as an example of a solid-state image capturing apparatus; however, it is also possible to apply the method for manufacturing the solid-state image capturing apparatus according to the present invention to a CMOS type image sensor.

Embodiment 2

Although not specifically described in the embodiment described above, an electronic information device having an image input device will be described hereinafter as Embodiment 2 of the present invention. The electronic information device having an image input device, such as a digital camera (e.g., digital video camera and digital still camera), an image input camera, a scanner, a facsimile machine and a camera-equipped cell phone device, includes an image capturing section using the solid-state image capturing apparatus according to the embodiment described above.

Figure 15:
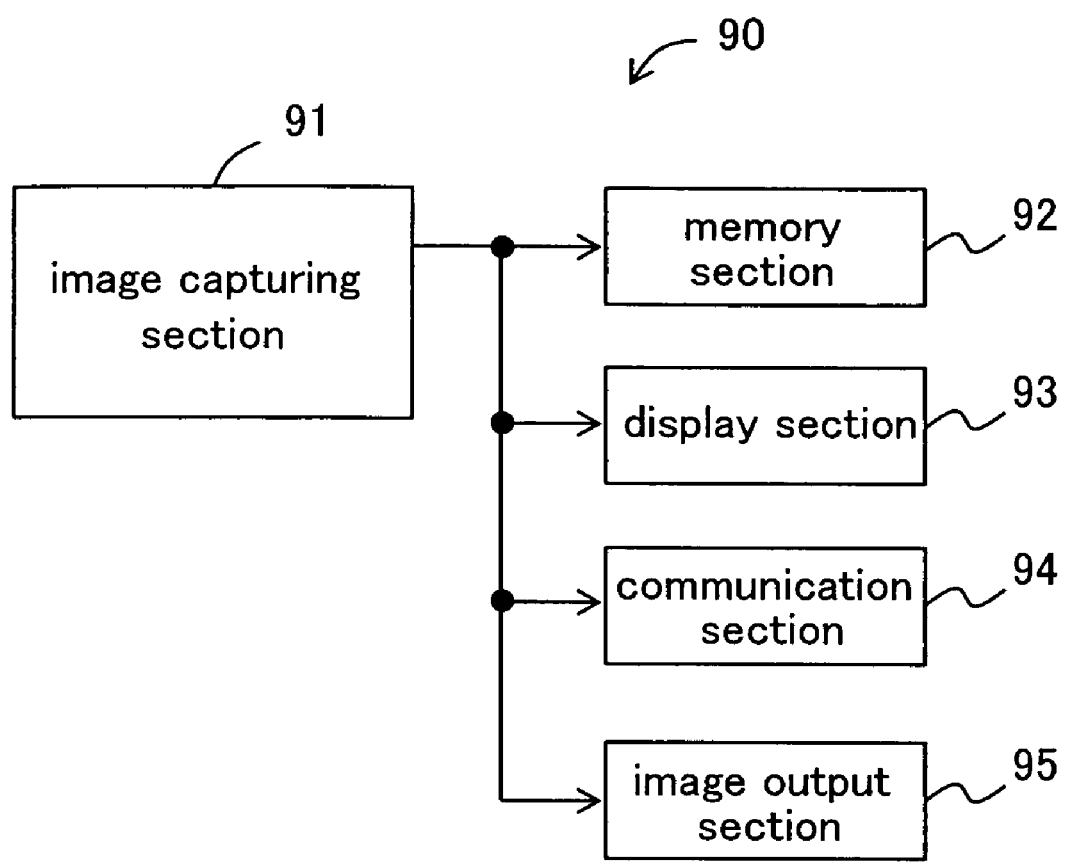
FIG. 15 is a block diagram illustrating an exemplary diagrammatic structure of an electronic information device, as Embodiment 2 of the present invention, using the solid-state image capturing apparatus according to Embodiment 1 of the present invention in an image capturing section.

FIG. 15 is a block diagram illustrating an exemplary diagrammatic structure of an electronic information device, as Embodiment 2 of the present invention, using the solid-state image capturing apparatus according to Embodiment 1 of the present invention as an image input device in an image capturing section.

The electronic information device 90 according to Embodiment 2 of the present invention as illustrated in FIG. 15 includes the solid-state image capturing apparatus obtained by a method for manufacturing a solid-state image capturing apparatus according to the embodiments of the present invention as an image capturing section 91 for capturing a subject. The electronic information device 90 further includes at least any of: a memory section 92 (e.g., recording media) for data-recording a high-quality image data obtained by image capturing by the image capturing section 91, after a predetermined signal process is performed on the image data for recording; a display section 93 (e.g., liquid crystal display device) for displaying this image data on a display screen (e.g., liquid crystal display screen) after a predetermined signal process is performed on the image data for display; a communication section 94 (e.g., transmitting and receiving device) for communicating this image data after a predetermined signal process is performed on the image data for communication; and an image output section 95 for printing (typing out) and outputting (printing out) this image data.

As described above, the present invention is exemplified by the use of its preferred embodiments. However, the present invention should not be interpreted solely based on the embodiments described above. It is understood that the scope of the present invention should be interpreted solely based on the claims. It is also understood that those skilled in the art can implement equivalent scope of technology, based on the description of the present invention and common knowledge from the description of the detailed preferred embodiments of the present invention. Furthermore, it is understood that any patent, any patent application and any references cited in the present specification should be incorporated by reference in the present specification in the same manner as the contents are specifically described therein.

INDUSTRIAL APPLICABILITY

In the field of a method for manufacturing a solid-state image capturing apparatus and an electronic information device using the solid-state image capturing apparatus manufactured by the method, the present invention is able to prevent a constituent element of a photo-acid-generating agent of a chemical amplification type resist film used as an implantation mask of an impurity from being implanted from the chemical amplification type resist film into a photodiode section (photoelectric conversion section) formed in a substrate, thereby reducing the occurrence of white defects and dark current due to crystal defect in the photodiode section (photoelectric conversion section) to improve the yield rate of the solid-state image capturing apparatus.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for manufacturing a solid-state image capturing apparatus including a pixel array constituted of a plurality of pixels, wherein each of the plurality of pixels includes a photoelectric conversion section, the method comprising the steps of:
    forming an impurity diffusion area in a surface area of a semiconductor substrate, wherein the impurity diffusion area constitutes the photoelectric conversion section; and
    forming a plurality of different impurity diffusion areas in the surface area of the semiconductor substrate, other than the impurity diffusion area constituting the photoelectric conversion section,
    wherein the step of forming the impurity diffusion area constituting the photoelectric conversion section includes a step of forming a resist mask for preventing implantation of an impurity in the surface area of the semiconductor substrate by the exposure and development of a resist material that includes a photo-acid-generating agent, and
    wherein the resist material is obtained by replacing at least a portion of iodonium salt contained in a chemical amplification type resist with a photo-acid-generating agent which does not contain iodine in order to reduce white defects, wherein the chemical amplification type resist contains iodonium salt content as the photo-acid-generating agent, wherein the iodonium salt content is determined based on at least a wavelength of an exposure light and a film thickness of the resist mask.

2. A method for manufacturing a solid-state image capturing apparatus according to claim 1, wherein the photo-acid-generating agent which does not contain iodine is selected from the group consisting of sulfonium salt as onium salt, halogen compound, and sulfonic acid ester.

3. A method for manufacturing a solid-state image capturing apparatus according to claim 2, wherein the resist material is obtained by replacing all the iodonium salt contained in the chemical amplification type resist with a photo-acid-generating agent that does not contain iodine.

4. A method for manufacturing a solid-state image capturing apparatus according to claim 2, wherein the resist material is obtained by replacing at least ½ of iodonium salt contained in the chemical amplification type resist with a photo-acid-generating agent that does not contain iodine.

5. A method for manufacturing a solid-state image capturing apparatus according to claim 2, wherein the resist material is obtained by replacing at least ⅞ of iodonium salt contained in the chemical amplification type resist with a photo-acid-generating agent that does not contain iodine.

6. A method for manufacturing a solid-state image capturing apparatus according to claim 2,
    wherein the resist mask is patterned such that a resist opening is positioned in an area corresponding to the photoelectric conversion section, and
    wherein the content of the photo-acid-generating agent of the chemical amplification type resist is further determined based on an inclining angle of a resist side surface in the resist opening, in addition to the wavelength of an exposure light and the film thickness of the resist mask.

7. A method for manufacturing a solid-state image capturing apparatus according to claim 6, wherein the step of forming the impurity diffusion area constituting the photoelectric conversion section includes a step of forming the impurity diffusion area constituting the photoelectric conversion section by performing implantation of an impurity using the resist mask.

8. A method for manufacturing a solid-state image capturing apparatus according to claim 1, wherein the exposure light is a light with a wavelength of 248 nm obtained by a KrF excimer laser.

9. A method for manufacturing a solid-state image capturing apparatus according to claim 8, wherein the resist mask has a film thickness of 3000 to 80000 Å.

10. A method for manufacturing a solid-state image capturing apparatus according to claim 8, wherein the resist mask has a film thickness of 20000 to 40000 Å.

11. A method for manufacturing a solid-state image capturing apparatus according to claim 1, wherein a step of forming at least one of the plurality of different impurity diffusion areas other than the impurity diffusion area constituting the photoelectric conversion section includes a step of forming a resist mask for preventing implantation of an impurity in the surface area of the semiconductor substrate by the exposure and development of a resist material that includes a photo-acid-generating agent; and
    the resist material is obtained by replacing at least a portion of iodonium salt contained in a chemical amplification type resist with a photo-acid-generating agent which does not contain iodine, the chemical amplification type resist contains iodonium salt content as the photo-acid-generating agent, wherein the iodonium salt content is determined based on at least a wavelength of an exposure light and a film thickness of the resist mask.

12. A method for manufacturing a solid-state image capturing apparatus according to claim 11, wherein at least one of the plurality of different impurity diffusion areas other than the impurity diffusion area constituting the photoelectric conversion section is an impurity diffusion area adjacent to the impurity diffusion area constituting the photoelectric conversion section.

13. A method for manufacturing a solid-state image capturing apparatus according to claim 12, wherein the photo-acid-generating agent which does not contain iodine is selected from the group consisting of sulfonium salt as onium salt, halogen compound, and sulfonic acid ester.

14. A method for manufacturing a solid-state image capturing apparatus according to claim 12, wherein the resist material is obtained by replacing all the iodonium salt contained in the chemical amplification type resist with a photo-acid-generating agent that does not contain iodine.

15. A method for manufacturing a solid-state image capturing apparatus according to claim 12, wherein the resist material is obtained by replacing at least ½ of iodonium salt contained in the chemical amplification type resist with a photo-acid-generating agent that does not contain iodine.

16. A method for manufacturing a solid-state image capturing apparatus according to claim 12, wherein the resist material is obtained by replacing at least ⅞ of iodonium salt contained in the chemical amplification type resist with a photo-acid-generating agent that does not contain iodine.

17. A method for manufacturing a solid-state image capturing apparatus according to claim 11,
wherein the solid-state image capturing apparatus includes: a vertical electric charge transfer section for transferring a signal charge generated at the photoelectric conversion section; an electric charge readout section formed in between the photoelectric conversion section and the vertical electric charge transfer section for reading out the electric charge from the photoelectric conversion section to the vertical electric charge transfer section; and a channel stop section for electrically separating adjacent photoelectric conversion sections, and electrically separating the photoelectric conversion section and the vertical electric charge transfer section, and
wherein each of the plurality of different impurity diffusion areas other than the impurity diffusion area constituting the photoelectric conversion section, forms the vertical electric charge transfer section, the electric charge readout section, and the channel stop section.

18. A method for manufacturing a solid-state image capturing apparatus according to claim 17, wherein a step of forming any one of the plurality of different impurity diffusion areas other than the impurity diffusion area constituting the photoelectric conversion section includes a step of forming an impurity diffusion area constituting the vertical electric charge transfer section, the electric charge readout section, or the channel stop section, by implanting an impurity using the resist mask.

19. A method for manufacturing a solid-state image capturing apparatus according to claim 18,
wherein the step of forming at least one of the plurality of different impurity diffusion areas other than the impurity diffusion area constituting the photoelectric conversion section includes a step of forming an impurity diffusion area constituting the vertical electric charge transfer section,
wherein the resist mask is patterned such that a resist opening is positioned in an area corresponding to the vertical electric charge transfer section, and
wherein the content of the photo-acid-generating agent of the chemical amplification type resist is further determined based on an inclining angle of a resist side surface in the resist opening, in addition to the wavelength of an exposure light and the film thickness of the resist mask.

20. A method for manufacturing a solid-state image capturing apparatus according to claim 18,
wherein the step of forming at least one of the plurality of different impurity diffusion areas other than the impurity diffusion area constituting the photoelectric conversion section is a step of forming an impurity diffusion area constituting the electric charge readout section,
wherein the resist mask is patterned such that a resist opening is positioned in an area corresponding to the electric charge readout section, and
wherein the content of the photo-acid-generating agent of the chemical amplification type resist is further determined based on an inclining angle of a resist side surface in the resist opening, in addition to the wavelength of an exposure light and the film thickness of the resist mask.

21. A method for manufacturing a solid-state image capturing apparatus according to claim 18,
wherein the step of forming at least one of the plurality of different impurity diffusion areas other than the impurity diffusion area constituting the photoelectric conversion section is a step of forming an impurity diffusion area constituting the channel stop section,
wherein the resist mask is patterned such that a resist opening is positioned in an area corresponding to the channel stop section, and
wherein the content of the photo-acid-generating agent of the chemical amplification type resist is further determined based on an inclining angle of a resist side surface in the resist opening, in addition to the wavelength of an exposure light and the film thickness of the resist mask.

22. A method for manufacturing a solid-state image capturing apparatus including a pixel array constituted of a plurality of pixels, each of the plurality of pixels including a photoelectric conversion section, the method comprising the steps of:
forming an impurity diffusion area in a surface area of a semiconductor substrate, wherein the impurity diffusion area constitutes the photoelectric conversion section; and
forming a plurality of different impurity diffusion areas in the surface area of the semiconductor substrate, other than the impurity diffusion area constituting the photoelectric conversion section,
wherein the step of forming the impurity diffusion area constituting the photoelectric conversion section includes the step of:
forming an insulation film which is formed of a silicon oxide film or a silicon nitride film in a surface area of the semiconductor substrate;
forming an insulation hard mask for preventing impurity implantation in order to reduce white defects by patterning the insulation film with a resist mask; and
selectively implanting an impurity using the insulation hard mask.

* * * * *

UNITED STATES PATENT AND TRADEMARK OFFICE
CERTIFICATE OF CORRECTION

| | | |
|---|---|---|
| PATENT NO. | : 7,867,810 B2 | Page 1 of 1 |
| APPLICATION NO. | : 12/384938 | |
| DATED | : January 11, 2011 | |
| INVENTOR(S) | : Tetsuya Hatai | |

It is certified that error appears in the above-identified patent and that said Letters Patent is hereby corrected as shown below:

On the title page, between items (22) and (65), please add the following:

(30)         Foreign Application Priority Data

April 14, 2008   [JP]   Japan ......................2008-105106

Signed and Sealed this

Thirty-first Day of May, 2011

David J. Kappos
*Director of the United States Patent and Trademark Office*